United States Patent
Nishibayashi et al.

(10) Patent No.: US 11,181,590 B2
(45) Date of Patent: Nov. 23, 2021

(54) DIAMOND MAGNETIC SENSOR

(71) Applicant: Sumitomo Electric Industries, Ltd., Osaka (JP)

(72) Inventors: Yoshiki Nishibayashi, Itami (JP); Kazuhiro Ikeda, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 147 days.

(21) Appl. No.: 16/487,166

(22) PCT Filed: Feb. 21, 2018

(86) PCT No.: PCT/JP2018/006280
§ 371 (c)(1),
(2) Date: Aug. 20, 2019

(87) PCT Pub. No.: WO2018/155504
PCT Pub. Date: Aug. 30, 2018

(65) Prior Publication Data
US 2020/0057117 A1    Feb. 20, 2020

(51) Int. Cl.
*G01R 33/34* (2006.01)
*G01R 33/032* (2006.01)

(52) U.S. Cl.
CPC ........... *G01R 33/032* (2013.01); *G01R 33/34* (2013.01)

(58) Field of Classification Search
CPC .. G01R 33/032; G01R 33/0322; G01R 33/26; G01R 33/24; G01R 33/44; G01R 33/48;
(Continued)

(56) References Cited

U.S. PATENT DOCUMENTS

2010/0271016 A1  10/2010  Barclay et al.
2011/0062957 A1*  3/2011  Fu ................... G01N 24/088
                                                         324/307
(Continued)

FOREIGN PATENT DOCUMENTS

JP  S63-277048 A  11/1988
JP  H02-284090 A  11/1990
(Continued)

OTHER PUBLICATIONS

Rolf Simon Schoenfeld et al, "Realtime Magnetic Field Sensing and Imaging using a Single Spin in Diamond", Freie Universität Berlin, Institut für Experimentalphysik, Arnimallee 14, 14195 Berlin, Germany, Jan. 26, 2011, pp. 1-4.
(Continued)

*Primary Examiner* — Jermele M Hollington
*Assistant Examiner* — Taqi R Nasir
(74) *Attorney, Agent, or Firm* — Faegre Drinker Biddle & Reath LLP

(57) ABSTRACT

A diamond magnetic sensor including diamond containing at least one $NV^-$ center, a microwave generator which emits microwaves to the diamond, an excitation light generator which emits excitation light to the $NV^-$ center of the diamond, and a fluorescence sensor which receives fluorescence produced from the $NV^-$ center of the diamond includes a pattern measurement apparatus which measures a temporal change pattern of magnetic field intensity based on variation in fluorescence intensity sensed by the fluorescence sensor.

13 Claims, 18 Drawing Sheets

(58) Field of Classification Search
CPC ........ G01R 33/02; B82Y 25/00; B82Y 30/00; B82Y 35/00; G01C 21/00; G05D 1/0088; G05D 1/101; B64C 2201/141
See application file for complete search history.

(56) References Cited

U.S. PATENT DOCUMENTS

| | | |
|---|---|---|
| 2016/0146904 A1 | 5/2016 | Stetson, Jr. et al. |
| 2016/0223621 A1 | 8/2016 | Kaup et al. |
| 2016/0313408 A1* | 10/2016 | Hatano ................ G01R 33/032 |
| 2016/0334474 A1 | 11/2016 | Hatano et al. |
| 2016/0356863 A1* | 12/2016 | Boesch .................. G01C 21/00 |
| 2017/0010334 A1 | 1/2017 | Krause et al. |

FOREIGN PATENT DOCUMENTS

| | | | |
|---|---|---|---|
| JP | H10-197567 A | 7/1998 | |
| JP | H11-38057 A | 2/1999 | |
| JP | 2001-112731 A | 4/2001 | |
| JP | 2009-297224 A | 12/2009 | |
| JP | 2012-121748 A | 6/2012 | |
| JP | 2016-205954 A | 12/2016 | |
| WO | WO-2015/107907 A1 | 7/2015 | |
| WO | WO 2016/118791 A1 | 7/2016 | |
| WO | WO-2016118791 A1 * | 7/2016 | ........... G01R 33/032 |

OTHER PUBLICATIONS

J. R. Maze et al., "Nanoscale magnetic sensing with an individual electronic spin in diamond," Nature, Oct. 2008, pp. 644-648, vol. 455, No. 2.

* cited by examiner

DIAMOND MAGNETIC SENSOR

TECHNICAL FIELD

The present invention relates to a magnetic sensor including diamond.

The present application claims priority to Japanese Patent Application No. 2017-029689 filed on Feb. 21, 2017, the entire contents of which are incorporated by reference.

BACKGROUND ART

A Hall element has widely been used as a magnetic sensor which measures intensity of magnetic field. SQUID making use of superconduction has been known for measurement of small magnetic field. A sensor capable of highly sensitive detection of magnetic field in a small region by making use of a nitrogen-vacancy complex ($NV^-$ center) formed in diamond has recently been proposed as a new sensor (NPL 1). Such a sensor detects red light produced as fluorescence from an $NV^-$ center when it emits green light as excitation light to $NV^-$ centers while it emits microwaves at a frequency of approximately 2.8 GHz to diamond containing $NV^-$ centers. Intensity of magnetic field is detected based on variation dependent on magnetic field intensity, in lowering point of fluorescence intensity in sweeping the frequency of emitted microwaves (PTL 1). Studies about diamond suitable for such a sensor have been conducted (PTL 2).

CITATION LIST

Patent Literature

PTL 1: WO2015/107907A1
PTL 2: Japanese Patent Laying-Open No. 2012-121748

NON PATENT LITERATURE

NPL 1: J. R. Maze et al., "Nanoscale magnetic sensing with an individual electronic spin in diamond," Nature, Vol. 455, p. 644 (2008)

SUMMARY OF INVENTION

Technical Problem

A sensor making use of $NV^-$ centers is capable of measuring variation in very weak magnetic field intensity. A method of measuring variation in fluorescence intensity with a frequency of emitted microwaves being fixed has been restricted in that a range of detectable magnetic field intensity is narrow. In general, there is ambient magnetic field larger than small magnetic field to be detected. Therefore, a large-scale shielded room for cutting off ambient magnetic field should be provided. Even in such a case, it is difficult to completely cut off ambient magnetic field such as magnetic field originating from an electric circuit such as a sensor, and such difficulty has imposed great restrictions on practical use. An object of the present invention is to obtain a diamond magnetic sensor which achieves a broadened range of detectable magnetism intensity and is suitable for practical use with a scheme for eliminating ambient magnetic field.

Solution to Problem

A diamond magnetic sensor according to one manner of the present invention includes diamond containing at least one $NV^-$ center, a microwave generator which emits microwaves to the diamond, an excitation light generator which emits excitation light to the $NV^-$ center of the diamond, and a fluorescence sensor which receives fluorescence produced from the $NV^-$ center of the diamond, and the diamond magnetic sensor includes a pattern measurement apparatus which measures a temporal change pattern of magnetism intensity based on variation in fluorescence intensity sensed by the fluorescence sensor.

According to another manner, a diamond magnetic sensor includes diamond in a form of a plate containing a plurality of $NV^-$ center regions in a plan view, a magnetic array arranged in correspondence with the $NV^-$ center regions, a microwave generator which emits microwaves to the diamond, an excitation light generator which emits excitation light to the diamond, and a fluorescence sensor array which individually receives fluorescence produced from the plurality of $NV^-$ center regions.

Advantageous Effects of Invention

According to the above, a diamond magnetic sensor which achieves a broadened range of detectable magnetism intensity and is suitable for practical use by eliminating ambient magnetic field can be obtained.

DETAILED DESCRIPTION

Embodiments of the Present Invention

Figure 1:
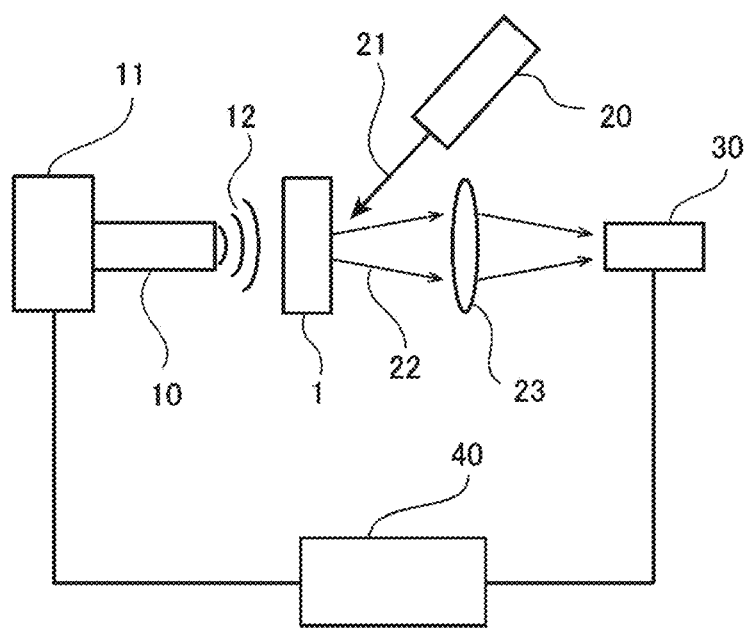
FIG. 1 is a schematic diagram showing a basic configuration of a diamond magnetic sensor according to a first embodiment of the present invention.

Suitable embodiments of the present invention will be listed.

One of embodiments is directed to a diamond magnetic sensor including diamond containing at least one $NV^-$ center, a microwave generator which emits microwaves to the diamond, an excitation light generator which emits excitation light to the $NV^-$ center of the diamond, and a fluorescence sensor which receives fluorescence produced from the $NV^-$ center of the diamond, the diamond magnetic sensor including a pattern measurement apparatus which measures a temporal change pattern of magnetic field intensity based on variation in fluorescence intensity sensed by the fluorescence sensor.

The pattern measurement apparatus desirably performs a function to control sweep of a frequency of the microwaves, a function to specify a frequency of the microwaves at which a relative minimum value of the fluorescence intensity is produced, and a function to detect magnetic field intensity based on the specified frequency, and the pattern measurement apparatus measures the temporal change pattern of the magnetic field intensity by repeating detection of the magnetic field intensity by repeating sweep of the frequency.

A data analysis apparatus which separates intensity of magnetic field originating from a measurement environment and intensity of magnetic field originating from an object to be measured from each other based on the temporal change pattern is desirably further provided.

The data analysis apparatus is desirably the diamond magnetic sensor which separates the intensity of the magnetic field by filtering based on a frequency in the temporal change pattern.

Another embodiment is directed to a diamond magnetic sensor including diamond in a form of a plate containing a plurality of $NV^-$ center regions in a plan view, a magnetic array arranged in correspondence with the $NV^-$ center regions, a microwave generator which emits microwaves to the diamond, an excitation light generator which emits excitation light to the diamond, and a fluorescence sensor array which individually receives fluorescence produced from the plurality of $NV^-$ center regions.

In each manner described above, a cancellation coil which lowers ambient magnetic field applied to the diamond by producing prescribed magnetic field is desirably further provided.

The diamond magnetic sensor is desirably configured to have the diamond, the microwave generator, the excitation light generator, and the fluorescence sensor or a fluorescence sensor array mounted on a single circuit board directly or with another member being interposed. Improvement in performance and reliability as a magnetic sensor, such as a smaller and more compact size of a configuration of the entire sensor, a stabilized optical axis, higher efficiency in emission of excitation light and emission of microwaves, and increase in accuracy and stability of an emission position, is thus achieved.

A configuration can also further include a magnetic shield which cuts off ambient magnetic field applied to the diamond and an antenna which introduces an external signal including an object to be sensed into the inside of the magnetic shield.

In the diamond magnetic sensor above, the pattern measurement apparatus can also be implemented by an apparatus which measures a spatial direction pattern of magnetic field intensity or measures a temporal change pattern for each spatial direction, instead of measurement of the temporal change pattern of magnetic field intensity.

In this case, the data analysis apparatus is desirably implemented by an apparatus which separates intensity of magnetic field originating from a measurement environment and intensity of magnetic field originating from an object to be measured from each other based on the spatial direction pattern or on both of the spatial direction pattern and the temporal change pattern.

Yet another embodiment is directed to a diamond magnetic sensor including diamond in a form of a plate containing a plurality of $NV^-$ center regions in a plan view, a magnetic array arranged in correspondence with the $NV^-$ center regions, a microwave generator which emits microwaves to the diamond, an excitation light generator which emits excitation light to the diamond, and a fluorescence sensor which receives fluorescence produced from the plurality of $NV^-$ centers, magnitude of a relative minimum value of intensity of fluorescence produced from the plurality of $NV^-$ center regions being weighted differently for each $NV^-$ center region in accordance with a frequency of the emitted microwaves and magnetic field applied by the magnetic array.

A configuration including diamond in a form of a plate containing a plurality of $NV^-$ center regions in a plan view and a magnetic array arranged in correspondence with the $NV^-$ center regions, the diamond and the magnetic array being in contact with each other, is desirably employed as a unit of the diamond magnetic sensor. Fixed magnetic field can thus effectively be applied to each $NV^-$ center region.

Desirably, the diamond and an electronic circuit portion including the fluorescence sensor are distant from each other by at least 1 cm, and no member which electrically connects the diamond and the electronic circuit portion to each other is interposed between the diamond and the electronic circuit portion. In order to eliminate as much as possible, weak magnetic field generated from diamond serving as a sensing portion and the electronic circuit portion (an electronic circuit which generates excitation light, an electronic circuit as a fluorescence reception portion, and an electronic circuit which produces microwaves) in the diamond magnetic sensor, an apparatus with a structure in which the diamond and an electronic circuit are physically and spatially distant from each other is desirable. Thus, unnecessary influence by magnetic field onto the diamond magnetic sensor can be eliminated.

In the diamond magnetic sensor, the electronic circuit portion including the fluorescence sensor is spaced apart from the diamond by a solid through which visible light or infrared light passes, and can be used in at least one environment of a temperature environment different from a standard state, a pressure environment different from the standard state, and a gas atmosphere other than air.

The diamond magnetic sensor can be implemented by an apparatus with such a structure that the diamond serving as the sensing portion and the electronic circuit portion are spaced apart from each other by a plate transparent to a visible light region or an infrared region and are placed in environments different from each other. Thus, magnetic field in an environment against which an electronic circuit is not resistant but diamond is resistant can be measured.

Description of Embodiments of the Present Invention

An embodiment of the present invention will be described below with reference to the drawings. The drawings are schematic for the sake of clarity of description, unless otherwise specified. Therefore, a size and positional relation of members may be exaggerated or shown at a scale facilitating viewing. Elements having the same references allotted in a plurality of drawings represent identical portions or members. Though terms expressing positional relation such as up, down, left, and right directions are used as necessary for the sake of convenience of reference to the drawings or description, those terms are used for facilitating understanding of the invention and the technical scope of the present invention is not restricted by the meaning of those terms.

Basically, magnetism is used to mean a source of generation of magnetic field in a space (including a source with the N pole and the S pole and a quantum mechanical spin), whereas magnetic field is used to mean a field of magnetic force formed by magnetism in a space surrounding the same. A magnetic sensor herein refers to a sensor which measures magnetic field at a location where the sensor is located, which means, however, also measurement of magnetism. Therefore, the term "magnetism" is used. When it is not necessary to strictly distinguish between magnetism and magnetic field, clearly distinctive description is not provided.

An expression magnetic field intensity or magnetism intensity is used to mean that what is measured is intensity of magnetic field or magnetism. An expression a magnetic field direction or a magnetism direction is used to mean that what is measured is a direction of magnetic field or magnetism.

For facilitating understanding, what is expressed by magnetic field (magnetism) is a segment representing one moment of a temporal change pattern of magnetic field (magnetism). Even though magnetic field (magnetism) to be sensed cannot be distinguished from magnetic field (magnetism) other than that simply by a value of magnetic field (magnetism) itself at one moment, they can be distinguished from each other when they are observed from a point of view of a temporal change pattern of magnetic field (magnetism) intensity or a magnetic field (magnetism) direction. This is because characteristics of variation in intensity or direction thereof are different by paying attention to time or a frequency.

They can further be distinguished from each other by paying attention also to a spatial direction pattern representing a spatial distribution of magnetism. The temporal change pattern refers to overall variation over time in magnetic field (magnetism) intensity or a direction thereof. The spatial direction pattern refers to a distribution of magnetic field (magnetism) directions observed at positions of sensing. Therefore, a vector pattern of magnetic field can be obtained by combining the temporal change pattern and the spatial direction pattern with each other.

First Embodiment (Basic Operations by Diamond Magnetic Sensor)

FIG. 1 is a schematic diagram showing a basic configuration of a diamond magnetic sensor according to a first embodiment of the present invention. Diamond 1 is a sensing body which senses magnetic field. Diamond 1 includes at least one nitrogen-vacancy complex (which will be denoted as an $NV^-$ center below) in its crystal lattices. Diamond 1 with $NV^-$ centers is irradiated with microwaves 12 at a frequency of approximately 2.8 GHz from a microwave generation source 10. In this state, diamond 1 is irradiated with excitation light 21 from an excitation light generator 20 such as a light source of green laser having a wavelength of 532 nm. Diamond 1 then emits red light as fluorescence 22 from the NV⁻ centers. Emitted fluorescence 22 is condensed by a lens 23 and guided to a fluorescence sensor 30 which detects intensity thereof. Arrangement of each component is schematically depicted in FIG. 1 and limitation thereto is not intended. For example, the configuration is not limited to such a configuration that a side of diamond 1 where fluorescence 22 is detected and a side thereof irradiated with microwaves 12 are located on opposing front and rear sides and to such a configuration that excitation light 21 from excitation light generator 20 is emitted obliquely from above.

Fluorescence produced from NV⁻ centers of diamond is different in intensity between excitation from a ground state (a state that a magnetic quantum number of spins m, is 0) and excitation from a level at which electrons are resonated and excited by microwaves (a state that a magnetic quantum number of spins $m_s$ is −1 or +1). In the former example, fluorescence intensity is high, and in the latter example, fluorescence intensity is low. In excitation from the state that the magnetic quantum number of spins $m_s$ is ±1, fluorescence intensity is low because the electrons return to the ground state owing to non-light-emitting transition in which no fluorescence is emitted. At the level where electrons are excited, the number of electrons in the ground state which contribute to fluorescence by being excited by irradiation with microwaves at a specific frequency corresponding to a level difference decreases. Therefore, fluorescence intensity is lowered by irradiation with microwaves at this specific frequency. When there is magnetic field, an excited state is split in terms of energy (Zeeman effect). Therefore, there are at least two relative minimum values of fluorescence intensity. Since a difference in microwave frequency (difference in energy) between two levels which have been equal to each other before splitting by magnetic field is in proportion to magnetic field intensity, magnetic field intensity can be calculated based on the difference in microwave frequency.

When there is a single NV⁻ center, there is only one pair of relative minimum values in a graph showing fluorescence intensity in which the abscissa represents a microwave frequency. When directions (orientations) of bonds between N and V are different in an example where there are a plurality of NV⁻ centers, with a difference in magnetic field intensity for each direction, a graph of fluorescence intensity exhibits a plurality of relative minimum values. In a single piece of single-crystal diamond, there are four directions of bonds between N and V at the maximum. Therefore, the number of relative minimum values in a graph of fluorescence intensity does not exceed eight. Even though there are a plurality of relative minimum values, a pair of relative minimum values on which calculation of a difference in microwave frequency is based is produced by the same magnetic field intensity, and hence it can be distinguished from other pairs. Since each pair is centered around a frequency at the time when zero magnetic field is established (since the pair of relative minimum values has as its center, a frequency at the time when zero magnetic field is established), each pair can be distinguished from other pairs.

Figure 2:
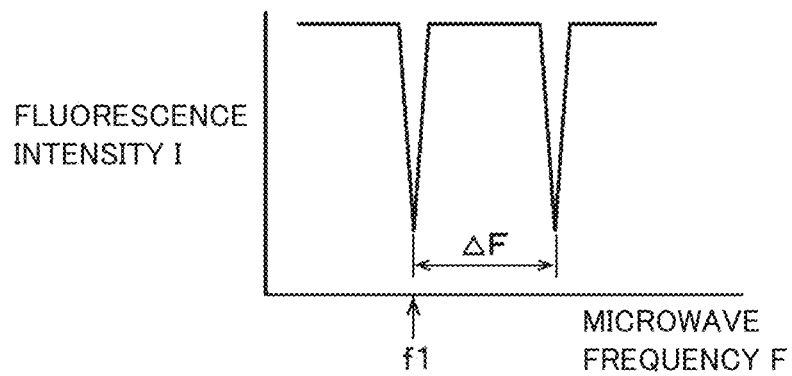
FIG. 2 is a graph for illustrating basic principles of the diamond magnetic sensor including $NV^-$ centers.

An example in which a frequency of microwaves emitted from microwave generation source 10 is swept by a frequency sweep apparatus 11 in FIG. 1 is considered. FIG. 2 is a graph for illustrating basic principles of the diamond magnetic sensor with NV⁻ centers and schematically shows relation between fluorescence intensity I detected by fluorescence sensor 30 and a microwave frequency F. As described above, there are at least two relative minimum values of fluorescence intensity I, and ΔF representing a difference in frequency is determined by intensity of magnetic field applied to NV⁻ centers in diamond 1. This magnetic field intensity refers to external magnetic field and inner magnetic field. External magnetic field refers to magnetic field caused by a factor outside diamond, and inner magnetic field refers to magnetic field caused by a factor inside diamond (for example, magnetic field caused by nuclear spin such as $^{13}C$ or $^{15}N$ or magnetic field caused by electron spin in a defect).

Figure 3:
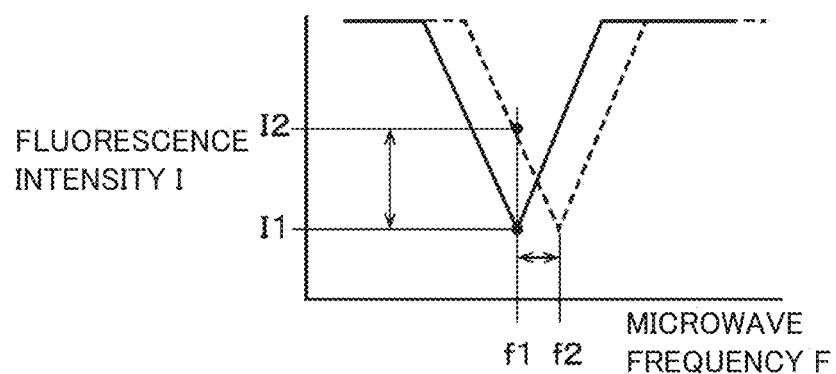
FIG. 3 is a graph for illustrating principles of measuring variation in small magnetic field with a conventional diamond magnetic sensor.

A diamond magnetic sensor of this type which has conventionally been under study captures, for example, variation in small magnetic field with a microwave frequency in FIG. 2 being fixed to f1. This state will be described with reference to FIG. 3, with attention being paid to a single NV⁻ center. FIG. 3 is a graph for illustrating principles of measuring variation in small magnetic field with a conventional diamond magnetic sensor. Fluorescence intensity I is detected with the microwave frequency being fixed to f1. In the example in FIG. 3, it is assumed that magnetic field in an initial state is applied to the NV⁻ center of diamond and a relative minimum value of fluorescence intensity exactly matches with frequency f1. Fluorescence intensity I1 is detected. It is assumed that magnetic field slightly varies and the relative minimum value of fluorescence intensity is displaced to a microwave frequency f2. In this state, what is detected is fluorescence intensity at fixed microwave frequency f1 and hence fluorescence intensity attains to I2. By thus measuring fluorescence intensity while microwaves at a constant frequency are emitted, variation in small magnetic field can be measured as variation in fluorescence intensity.

(Diamond Magnetic Sensor)

A diamond magnetic sensor according to the first embodiment of the invention of the present application will be described with reference to FIGS. 1 and 4 and 5. It has been described above that a relative minimum value of fluorescence intensity as in FIG. 2 is obtained by measuring intensity of fluorescence 22 with fluorescence sensor 30 by sweeping a frequency of microwaves 12 with frequency sweep apparatus 11 in FIG. 1.

Figure 4:
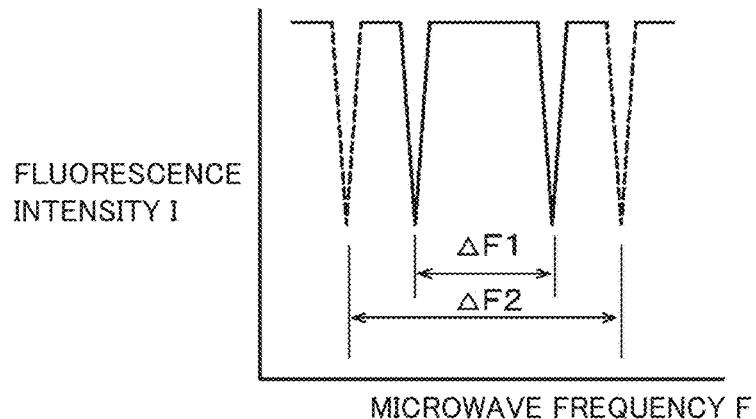
FIG. 4 is a graph for illustrating one measurement principle of the diamond magnetic sensor according to the present embodiment.
Figure 5:
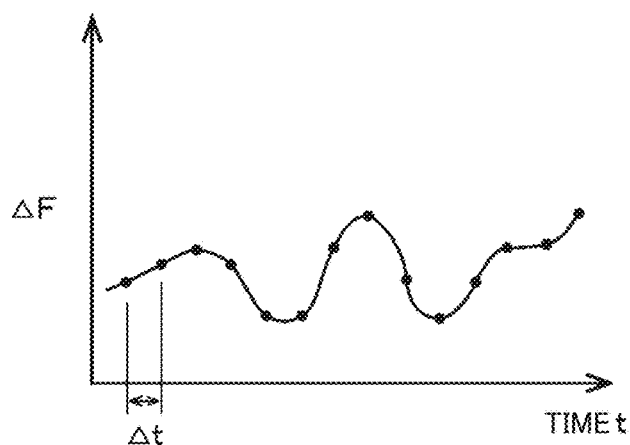
FIG. 5 is a graph for illustrating a temporal change pattern obtained by the diamond magnetic sensor according to the present embodiment.

FIG. 4 is a graph illustrating measurement principles in one embodiment of the diamond magnetic sensor in the present application. It is assumed that, when a microwave frequency is repeatedly swept, two relative minimum values of fluorescence intensity are detected by first sweep of the microwave frequency and a frequency difference is detected as ΔF1. It is assumed that magnetic field varies over time. It is assumed that, when a microwave frequency is swept again, a frequency difference representing a relative minimum value of detected fluorescence intensity is ΔF2. Thus, FIG. 5 shows plots of frequency differences detected by repeated sweep of a microwave frequency every time Δt, with the abscissa representing time. The ordinate represents detected frequency difference ΔF. ΔF can be converted to magnetism intensity by using a correspondence expression prepared in advance or conversion data brought in correspondence. A graph showing variation over time in magnetic field intensity with the ordinate representing magnetism intensity and with the abscissa representing time is called a temporal change pattern of magnetic field intensity, and a graph showing intensity of magnetism which is a source of generation of that magnetic field is called a temporal change pattern of magnetism intensity.

Though an example which uses a frequency difference between two relative minimum values is described above, an approach capable of measuring comparable variation should only be applicable. For example, with a median frequency between two relative minimum values having already been known, any one relative minimum value alone can also be detected and a difference from the already known median frequency can also be detected as ΔF/2. In this case, a span of sweep of a frequency can be narrower. A median value refers to a point where magnetism is zero, and when it is evaluated in advance, it can be calibrated later.

The diamond magnetic sensor in the embodiment of the present application can thus find a temporal change pattern of magnetism intensity based on a frequency at which a relative minimum value of detected fluorescence intensity is exhibited, by repeating sweep of a frequency of microwaves. In order to obtain a clearer temporal change pattern of magnetism intensity, a rate of sweep of a frequency of microwaves (time required for one sweep) is preferably shorter than 1 msec., more preferably shorter than 10 μsec., and further preferably not shorter than 1 μsec. This is because, as the rate of sweep of a frequency is higher, a waveform shorter in cycle or more complicated can be reproduced. A range of sweep of a frequency of microwaves (a frequency range) and an interval between frequencies (an interval between frequencies set in one sweep) are set to a range and an interval in which two relative minimum values of fluorescence intensity can be observed and preferably a range and an interval in which at least one relative minimum value can be observed, in order to clearly reproduce a relative minimum value. What is sensed is variation in frequency of microwaves. Therefore, even though a frequency is greatly shifted, sensitivity to magnetism is calculated as a frequency difference/a frequency and is not greatly varied. Small magnetic field can be sensed over a wider range of magnetic field than in an example where variation in intensity is given as a signal. Namely, high resolution sensitivity to magnetism intensity can be maintained. Resolution sensitivity to magnetism intensity depends on resolution of a frequency.

A magnetism measurement method presented here includes a procedure of sweeping a microwave frequency, a procedure of specifying the microwave frequency at which intensity of fluorescence measured during sweep exhibits a relative minimum value, a procedure of detecting magnetism intensity based on the specified frequency, and a procedure of measuring a temporal change pattern of magnetism intensity by repeating detection of magnetism intensity by repeating sweep of the frequency, with the use of a diamond magnetic sensor including diamond containing at least one NV⁻ center, a microwave generator which emits microwaves to the diamond, an excitation light generator which emits excitation light to the NV⁻ center of the diamond, and a fluorescence sensor which receives fluorescence radiated from the NV⁻ center of the diamond and including a pattern measurement apparatus which measures a temporal change pattern of magnetism intensity based on variation in fluorescence intensity.

A phase sweep apparatus instead of the frequency sweep apparatus can be employed in an alternative embodiment. Instead of the procedure of sweeping a frequency, a magnetism measurement method including a procedure of sweeping a phase can be implemented. A method of emitting combined waves of a microwave having a desired frequency width and a microwave resulting from phase shift thereof and sweeping the phase is applicable. In this case, magnetism intensity can be known by obtaining a spectrum as variation in fluorescence intensity with respect to a frequency by using Fourier transform of an amount of change in fluorescence intensity with an amount of phase shift.

Though the conventional approach described with reference to FIG. 3 has been able to capture variation in very weak magnetic field by observing variation in fluorescence intensity with a microwave frequency being fixed, it has been unable to address variation in large magnetic field. In contrast, an approach in the present application can handle an order-of-magnitude wider range of magnetic field to be detected while it can sense small magnetic field, with an amount of variation in relative minimum value of fluorescence intensity within a range of sweep of a frequency being defined as a limit.

A conventional approach to sensing of variation in fluorescence intensity can also obtain a temporal change pattern of magnetism intensity by digitizing outputs from a fluorescence intensity sensor. In this case, time response is determined by a response speed of the fluorescence intensity sensor and a time interval of sampling, and very high-speed response can be expected. The approach described with reference to FIGS. 4 and 5 obtains magnetism intensity each time a microwave frequency is swept. Therefore, an interval of data sampling (a time from one sweep to next sweep in a plurality of times of sweep) is dependent on a rate of sweep of a microwave frequency. A preferred sweep rate or the like is as described previously. A pattern of variation in magnetism intensity as a background or an environment is preferably not higher than 100 Hz or 1000 Hz, and a pattern of variation in magnetism intensity to be captured in that range is preferably higher than 1 kHz, more preferably higher than 100 kHz, and further preferably higher than 1 MHz. It is not the case, however, if magnetism intensity to be captured in ambient magnetism intensity is successfully separated from the ambient magnetism intensity by analysis. In analyzing a temporal change pattern, it is effective to leave only magnetism intensity to be captured by subtracting ambient magnetism intensity, and preferably a frequency lower than 70 Hz, more preferably a frequency lower than 1 kHz, or further preferably a frequency lower than 10 kHz is cut off.

In a manner of use of phase shift described above, magnetism intensity is obtained each time an amount of phase shift is swept. Therefore, an interval of data sampling is dependent on a rate of sweep of an amount of phase shift of a microwave.

Second Embodiment (Diamond Magnetic Sensor)

Figure 6:
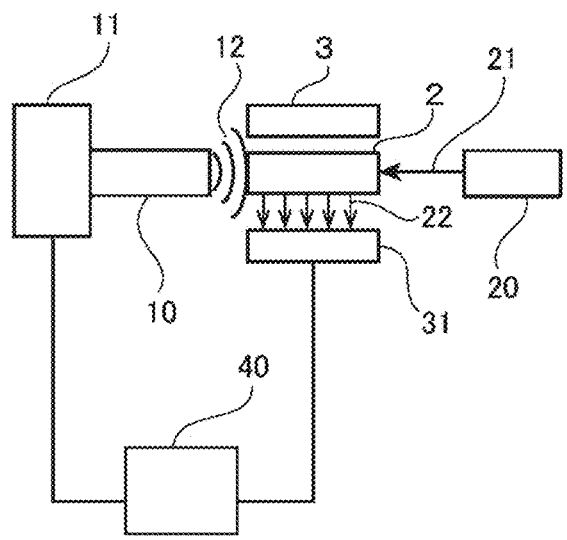
FIG. 6 is a schematic diagram showing a basic configuration of a diamond magnetic sensor according to a second embodiment of the present invention.

FIG. 6 is a schematic diagram showing a basic configuration of a diamond magnetic sensor according to a second embodiment of the present invention. Diamond 2 is in a form of a plate and contains a plurality of NV⁻ center regions in a plan view. A view of diamond from a main surface which defines the form of the plate (one surface of front and rear surfaces largest in area) is defined as a plan view. Diamond 2 includes a region where a plurality of NV⁻ centers are located, and each NV⁻ center region is a region where one NV⁻ center or a plurality of NV⁻ centers is/are aggregated. The plurality of NV⁻ center regions may regularly or randomly be arranged in the plan view. A location of each NV⁻ center region should be specified in advance. In a method of forming NV⁻ centers of diamond 2 arranged in an array, NV⁻ centers can be formed in an array by locally providing vacancies (V) in an array by electron beam irradiation through a mask formed by photolithography, or a space in diamond where NV⁻ centers are located in an array can be processed like a box with a similar photolithographic approach. Single pieces of diamond each containing an NV⁻ center can also be aligned on substrates different in type.

A magnetic array 3 as a magnetic field generator is arranged in correspondence with the plurality of NV⁻ center regions. Magnetic array 3 is arranged on a main surface or a rear surface of diamond 2. In magnetic array 3, a plurality of magnetism generation members are arranged at positions corresponding to locations of the plurality of NV$^-$ center regions in diamond 2. Therefore, it is easier to prepare (arrange in correspondence) regular arrangement than random arrangement. In general, the magnetism generation member is made of a magnetic material (a ferromagnet) and should only have already known magnetism and be small enough for arrangement. A magnetic material may be patterned, or a sheet of a magnetic material with a magnetic pattern can also be employed. Intensity of magnetic field formed in an individual NV$^-$ center region by the magnetic material can be controlled based on a volume (an amount) of the magnetic material, and intensity can be known by measuring in advance a spatial distribution in an environment free from magnetic field.

Ultimately a single NV$^-$ may implement the NV$^-$ center region described previously, and a magnetism generation source may ultimately be nuclear magnetism of $^{13}$C or $^{15}$N representing an isotope in diamond. Different magnetic field intensity to be applied to NV$^-$ is automatically and randomly generated by a difference in shortest distance between $^{13}$C or $^{15}$N and NV$^-$. When the NV$^-$ center can individually be observed with a microscope, each one corresponds to each of a plurality of randomly arranged NV$^-$ center regions.

The greatest feature of the present embodiment, that is, a form that a different magnetic array and an array of NV$^-$ center regions are arranged in single piece of diamond 2, is to allow NV$^-$ centers which have experienced various types of Zeeman splitting to spatially separately be known. The ability to separately know NV$^-$ centers means instantaneously knowing a state that different microwave frequencies have been changed, which represents one form of assistance in sweep of a microwave frequency. Relation between magnetism intensity and a microwave frequency is preferably the same for all NV$^-$ center regions. Even though the relation is different, however, no problem arises if the NV$^-$ center region is initially individually calibrated.

Referring to FIG. 6, a microwave generator which emits microwaves to diamond 2 is constituted at least of microwave generation source 10 and preferably frequency sweep apparatus 11. Microwaves 12 are configured to uniformly be emitted to the entire diamond 2. Excitation light generator 20 which emits excitation light 21 to diamond 2 is provided. All NV$^-$ centers in diamond 2 are irradiated with excitation light 21. The excitation light generator may spread light, for example, from one laser light source by an optical system, or it may include a plurality of light sources. In order to individually receive fluorescence 22 produced from the plurality of NV$^-$ center regions, a fluorescence sensor array 31 is provided on the main surface of diamond 2 or at an opposed position in the rear surface thereof. Fluorescence sensor array 31 should only be implemented by arranging a plurality of light reception elements. Fluorescence sensor array 31 may be such that a plurality of individually independent light reception elements are arranged at positions opposed to the NV$^-$ center regions of diamond 2 or such that a large number of small light reception elements are arranged like complementary metal-oxide-semiconductor (CMOS) sensors or charge coupled devices (CCD). Alternatively, light may be projected on a light reception element as being spread through a lens system.

In order to control a frequency of microwaves and to measure intensity of received fluorescence to obtain a temporal change pattern, a pattern measurement apparatus 40 is provided.

Description here shows an example in which a plurality of NV$^-$ centers are located in a single diamond substrate. A plurality of NV$^-$ centers may be located in a plurality of diamond substrates and the plurality of diamond substrates may be combined. A single piece of diamond is preferred because the sensor is compact as a whole and measurement in an identical magnetic field environment is facilitated. For example, an already known method of forming a vacancy by electron beam irradiation in diamond containing nitrogen in its crystal lattices and thereafter forming an N—V defect by annealing can be employed as a method of forming an NV$^-$ center in diamond.

Relation of an NV$^-$ center region in diamond 2 with magnetic array 3 and fluorescence sensor array 31 will further be described with reference to FIGS. 7A, 7B, and 7C.

Figure 7A:
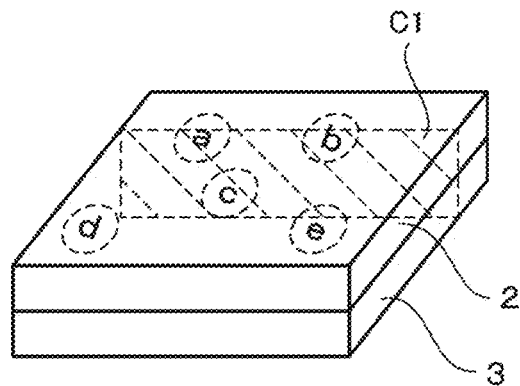
FIG. 7A is a perspective view showing a state of arrangement of diamond and a magnetic array.

FIG. 7A is a perspective view schematically showing a state of arrangement of diamond 2 and magnetic array 3 as being layered on each other. Magnetic array 3 is arranged as being opposed to one main surface of diamond 2 in a form of a flat plate. Diamond 2 is assumed to include five regions including NV$^-$ centers and respective regions are called a to e. The number of regions can arbitrarily be determined as necessary and arrangement thereof is not particularly limited either. A single NV$^-$ center or a plurality of NV$^-$ centers may be included in one region. When there are a plurality of NV$^-$ centers, intensity of detected fluorescence can be higher and intensity exhibiting a relative minimum value tends to broadly be distributed.

In the magnetic array, a magnetic material which produces already known magnetism is arranged at a location corresponding to each of regions a to e in diamond 2 in a plan view. FIG. 7B schematically shows a cross-section C1 obtained by cutting perpendicular to the main surface so as to include region a and region b in FIG. 7A. Thus, a magnetic material 3*a* is embedded in correspondence with region a and a magnetic material 3*b* is embedded in correspondence with region b. In this example, regions a, b, c, d, and e will be described below as producing magnetism at regular intervals in increasing order.

Figure 7B:
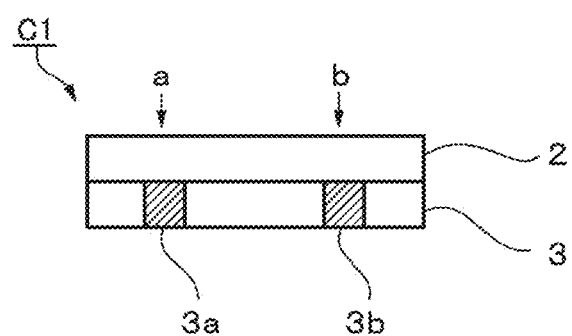
FIG. 7B is a cross-sectional view showing a cross-section C1 which passes through a region a and a region b in FIG. 7A.
Figure 7C:
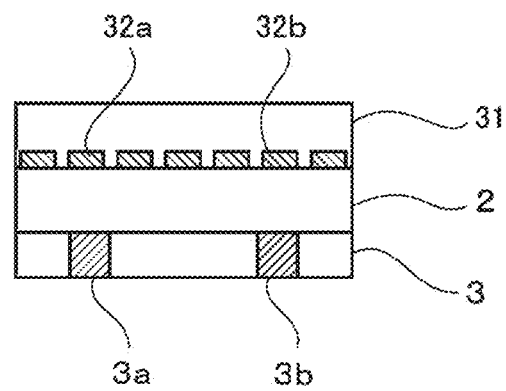
FIG. 7C is a cross-sectional view showing a state of further arrangement of a fluorescence sensor array 31 in FIG. 7B.

FIG. 7C is a cross-sectional view schematically showing a state of further arrangement of fluorescence sensor array 31 in FIG. 7B. A light reception element array like a CMOS sensor or a CCD is shown by way of example as a fluorescence sensor array. In fluorescence sensor array 31, a light reception sensor is two-dimensionally arranged on one surface. FIG. 7C shows a light reception element 32*a* located at a location corresponding to region a and a light reception element 32*b* located at a location corresponding to region b. Though an output from a light reception element at a location corresponding to a region other than the NV$^-$ center region is not used, it can also be used for measurement of background noise. In addition to such a general-purpose light reception element array, a light reception element arranged in accordance with a location of an NV$^-$ center region may be used as a fluorescence sensor array.

A filter which cuts off excitation light can be arranged as appropriate between an NV$^-$ center and a light reception element. A part of the NV$^-$ center can be magnified to condense light therefrom by a lens, and the light can be guided to the light reception element as appropriate. A scheme for confining excitation light such that the excitation light is less likely to exit to the outside can also be provided as appropriate between the excitation light generator and the diamond including NV$^-$ centers.

Figure 8:
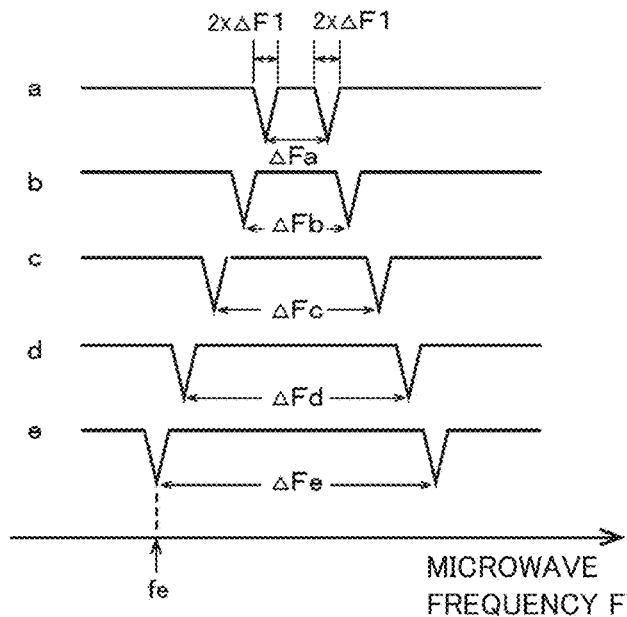
FIG. 8 is a graph showing fluorescence intensity signals corresponding to respective regions a to e.

A signal detected by such a sensor will be described below. FIG. 8 is a graph for illustrating a difference in signal when fluorescence intensity corresponding to each of region a to region e is measured when a microwave frequency is swept. As described already, fluorescence intensity has two relative minimum values in accordance with the microwave frequency, and a frequency difference between relative minimum values is dependent on magnetic field intensity. In the present example, already known magnetic field is individually applied to each $NV^-$ center in each of region a to region e by magnetic array 3, and magnetic field becomes stronger at regular intervals (a difference being constant) in the order of a, b, c, d, and e.

A frequency difference between relative minimum values of intensity of fluorescence produced in correspondence with magnetic field applied to region a is denoted by $\Delta Fa$, a frequency difference between relative minimum values of intensity of fluorescence produced in correspondence with magnetic field applied to region b is denoted by $\Delta Fb$, a frequency difference between relative minimum values of intensity of fluorescence produced in correspondence with magnetic field applied to region c is denoted by $\Delta Fc$, a frequency difference between relative minimum values of intensity of fluorescence produced in correspondence with magnetic field applied to region d is denoted by $\Delta Fd$, and a frequency difference between relative minimum values of intensity of fluorescence produced in correspondence with magnetic field applied to region e is denoted by $\Delta Fe$. In this case, FIG. 8 shows fluorescence intensity sensed in correspondence with each region with the abscissa representing a microwave frequency. FIG. 8 shows a measured waveform (profile) obtained for each of regions a to e as being aligned in a vertical direction with a corresponding reference. Though the vertical direction of each waveform represents an axis of fluorescence intensity, the axis of fluorescence intensity is not in common but a flat portion in each waveform represents substantially the same fluorescence intensity. Thus, an interval between relative minimum values is wider with intensity of magnetic field. In the description below, for facilitating understanding, premises in the following are defined as a preferred manner. In the profile of fluorescence intensity corresponding to each region in FIG. 8, (i) a frequency width corresponding to a width of a valley of fluorescence intensity exhibiting a relative minimum value is denoted as $2\times\Delta F1$ (½ of a frequency width corresponding to a width of a valley is referred to as a frequency half-value width below) and (ii) a frequency difference between adjacent regions is equally $2\times\Delta F1$. Specifically, relation of $2\times\Delta F1=\Delta Fb-\Delta Fa=\Delta Fc-\Delta Fb=\Delta Fd-\Delta Fc=\Delta Fe-\Delta Fd$ is established.

When magnetic field to be detected is applied to the sensor with such setting being made, magnetic field to be detected is added to magnetic field originally applied by the magnetic array in each $NV^-$ center region. Therefore, an interval between relative minimum values of fluorescence intensity from each region with respect to a microwave frequency is uniformly varied by an amount of magnetic field added from the initial state. With variation being denoted as Fx, frequency differences corresponding to region a to region e are varied to $\Delta Fa+Fx$, $\Delta Fb+Fx$, $\Delta Fc+Fx$, $\Delta Fd+Fx$, and $\Delta Fe+Fx$, respectively.

Figure 9:
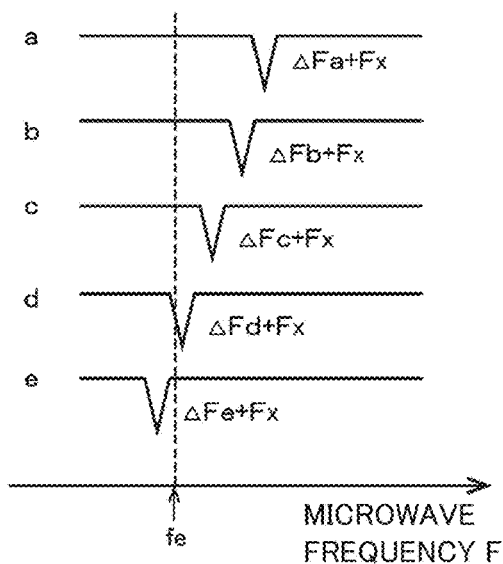
FIG. 9 is a graph showing a state of shift by Fx of a frequency interval as a result of application of certain external magnetic field.
Figure 10:
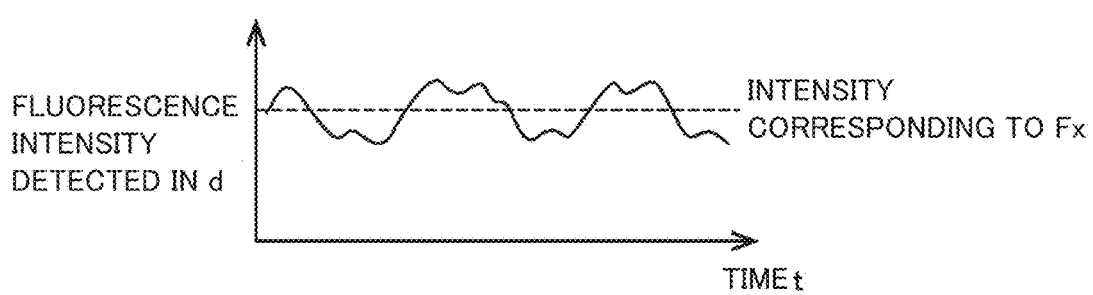
FIG. 10 is a graph showing variation in fluorescence intensity detected in a region d.

Measurement of a temporal change pattern of magnetism intensity by this sensor will now be described. It is assumed that, after the initial state in FIG. 8 is observed, a microwave frequency for measurement is fixed to fe shown in FIG. 8. It has been known that, before application of external magnetic field, fluorescence intensity detected at frequency fe as in FIG. 8 exhibited a relative minimum value only in region e and intensity of fluorescence from regions a, b, c, and d is the same as in an example where no magnetic field is applied. FIG. 9 shows an example of a state that intensity of fluorescence from all regions has shifted by frequency interval Fx as a result of application of certain external magnetic field as described above. Though FIG. 9 shows fluorescence intensity in each region with the abscissa representing a frequency, in actual measurement, intensity of fluorescence from each region is detected while a frequency is fixed to frequency fe. Therefore, fluorescence intensity in regions a, b, and c can be detected as being equal to the initial value, fluorescence intensity in region e can be detected as having varied to a state that magnetic field is zero, and fluorescence intensity in region d can be detected as having varied. Since a difference between regions has been set to $2\times\Delta F1$, it can be seen that applied magnetic field Fx is within a range of $\Delta F1\pm\Delta F1/2$. By measuring detected intensity of fluorescence from region d as change over time, for example, a temporal change pattern as in FIG. 10 can be obtained. FIG. 10 shows only variation in fluorescence intensity detected in region d. Fluorescence intensity varies around magnetic field corresponding to Fx. With further variation in magnetism intensity, intensity of fluorescence from region d becomes constant, and intensity of fluorescence from region c which is an adjacent region starts to vary. Therefore, a temporal change pattern of magnetism intensity over a larger variation width can be found by combining fluorescence intensities detected in respective regions.

An extent of detectable magnetic field can be broadened by increasing the number of $NV^-$ center regions and further increasing the number of magnetic fields applied in the initial state, which means that a measurement range can be broadened to an order-of-magnitude wider range of magnetic field without sweeping a microwave frequency even in measurement with a frequency being fixed. Therefore, a temporal change pattern of relatively high magnetism can be measured without being restricted by a time interval $\Delta t$ between sweeps of a microwave frequency as in data shown in FIG. 5. The number of regions ($NV^-$ center regions) therefor is preferably not smaller than one thousand, more preferably not smaller than ten thousand, and further preferably not smaller than one hundred and sixty thousand. With increase in number of regions, an area of the region tends to be smaller. Therefore, a size of the region (for example, a largest diameter) is preferably not greater than 100 more preferably not greater than 50 µm, and further preferably not greater than 20 µm. An interval (a shortest interval) between regions is preferably not greater than 100 µm, more preferably not greater than 50 and further preferably not greater than 20 µm. The size (for example, the largest diameter) of the region is preferably smaller than an interval between regions. It is not so difficult to realize such a size by making use of a microfabrication technique, and such a size is suitable as a guideline of a size that is readily optically sensed.

The magnetism measurement method presented here includes a procedure of measuring fluorescence intensity for each $NV^-$ center region and a procedure of measuring a temporal change pattern of magnetism intensity based on a position of variation in individual fluorescence (lowering from an example where magnetic field is zero) and variation in fluorescence intensity with the use of a diamond magnetic sensor including diamond in a form of a plate containing a plurality of $NV^-$ center regions in a plan view, a magnetic array arranged in correspondence with the $NV^-$ center regions, a microwave generator which emits microwaves to the diamond, an excitation light generator which emits excitation light to the diamond, and a fluorescence sensor array which individually receives fluorescence produced from the plurality of NV⁻ center regions. As in the first embodiment, a pattern of variation in magnetism intensity as a background or an environment is again preferably not higher than 100 Hz or 1000 Hz, and a pattern of variation in magnetism intensity to be captured is preferably higher than 1 kHz, more preferably higher than 100 kHz, and further preferably higher than 1 MHz. It is not the case, however, if magnetism intensity to be captured in ambient magnetism intensity is successfully separated from the ambient magnetism intensity by analysis. In analyzing a temporal change pattern, it is effective to leave only magnetism intensity to be captured by subtracting ambient magnetism intensity, and preferably a frequency lower than 70 Hz, more preferably a frequency lower than 1 kHz, or further preferably a frequency lower than 10 kHz is cut off.

Third Embodiment (Diamond Magnetic Sensor)

As described previously, it has been stated in the second embodiment that measurement over a wide range can be conducted without sweeping a microwave frequency, by measuring fluorescence detected in each NV⁻ center region as being spatially separated with the use of a diamond magnetic sensor including a plurality of NV⁻ center regions, a magnetic array, and a fluorescence sensor array. Measurement can also be conducted together with sweep of a microwave frequency. These features can further be developed. Specifically, a diamond magnetic sensor according to a third embodiment does not require sweeping of a microwave frequency, and in addition, measures a temporal change pattern of magnetism intensity based on variation in overall fluorescence intensity detected in each NV⁻ center region without knowing individual fluorescence from a spatially separated NV⁻ center.

A magnetism measurement method presented here includes a procedure of measuring intensity of overall fluorescence and a procedure of measuring a temporal change pattern of magnetism intensity based on variation in overall fluorescence intensity without using a fluorescence sensor array which individually receives fluorescence produced from a plurality of NV⁻ center regions in a diamond magnetic sensor.

In the present embodiment, a diamond magnetic sensor including diamond in a form of a plate containing a plurality of NV⁻ center regions in a plan view, a magnetic array arranged in correspondence with the NV⁻ center regions, a microwave generator which emits microwaves to the diamond, an excitation light generator which emits excitation light to the diamond, and a fluorescence sensor which receives fluorescence produced from the NV⁻ center regions of the diamond, magnitude of a relative minimum value of intensity of fluorescence produced from the plurality of NV⁻ center regions being weighted differently for each NV⁻ center region in accordance with a frequency of the emitted microwaves and magnetic field applied by the magnetic array, is employed.

As will be described later, variation from a maximum value to a relative minimum value of fluorescence intensity with respect to a microwave frequency draws a gentle curve by simultaneously superimposing on each other, valleys including relative minimum values of weighted intensity of fluorescence produced from the plurality of NV⁻ center regions. Therefore, even though a frequency varies over a wide range, change over time in fluorescence intensity at a specific frequency can be converted to change over time in microwave frequency by conducing measurement with a frequency being fixed to a specific frequency without sweeping a frequency. Namely, change over time in fluorescence intensity can be converted to a temporal change pattern of magnetism intensity. Furthermore, when at least a part is within a measurable range even though a part goes beyond the measurable range, effective data can be obtained.

By way of example, a magnetic array including ten NV⁻ center regions as in region a in FIG. 7A, eight NV⁻ center regions as in region b, six NV⁻ center regions as in region c, four NV⁻ center regions as in region d, and two NV⁻ center regions as in region e is made. The number refers to a numeric value for weighting (a weight) relating to intensity of fluorescence from each NV⁻ center region. A magnetic array in which a frequency half-value width (which is also simply referred to as a half-value width below) of a valley of each fluorescence intensity is set to ΔF1 shown in FIG. 8 is made. The number and a half-value width are by way of example, and a greater number is preferred. A half-value width of the valley is preferably not smaller than an interval between relative minimum values (for example, ΔFb-ΔFa (see FIG. 8)) in each NV⁻ center region, so that accuracy is enhanced. The number representing a weight may be different by two, and each number (weight) should only be set to a different integer value. An effect is achieved so long as each NV⁻ center region is differently weighted. Preferably, however, numbers close to each other are selected for regions close to each other in characteristics, and numbers distant and varied from each other are successively selected as characteristics are distant (monotonous increase, monotonous decrease, or combination thereof (for example, monotonous increase followed by monotonous decrease)).

Figure 11:
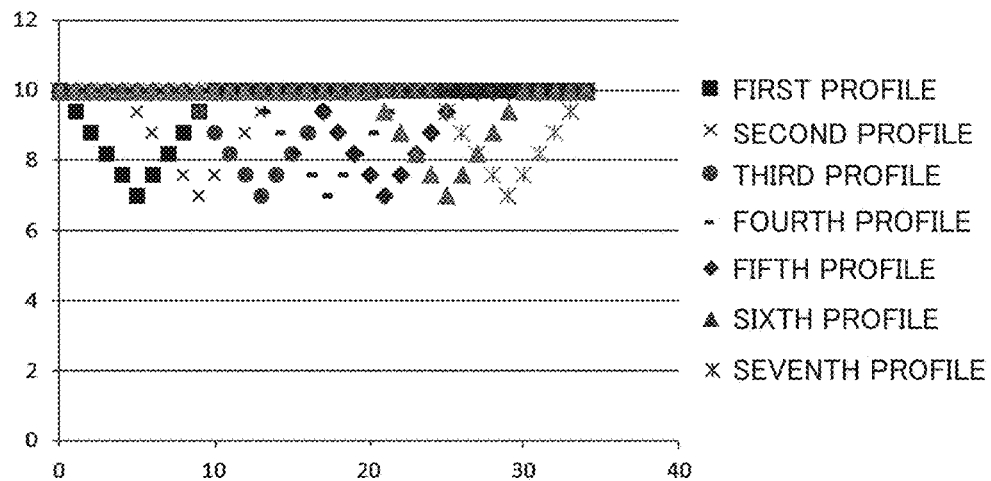
FIG. 11 is a graph for illustrating a method of measurement by a diamond magnetic sensor according to a third embodiment.

A result of simulation as to the above is shown with reference to FIGS. 11 to 16. In FIGS. 11 to 16, the abscissa in the graph corresponds to a microwave frequency and the ordinate corresponds to fluorescence intensity. The graph in FIG. 11 shows seven profiles of fluorescence intensity (corresponding to the waveform in FIG. 3) with symbols, and a half-value width of each valley is set to "5" An interval between points of adjacent relative minimum values (which is also referred to as an interval between valleys below) is equally set to "4". The meaning of each symbol is shown at the right end in FIG. 11.

Figure 12:
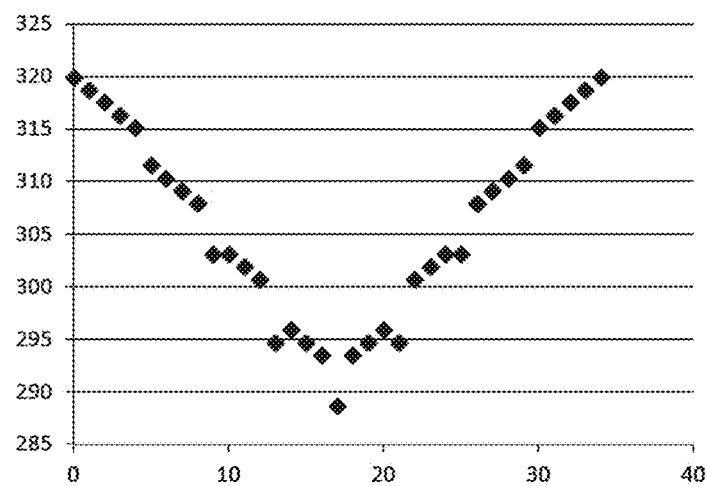
FIG. 12 is a graph showing a result of weighting and addition of the graph shown in FIG. 11.
Figure 13:
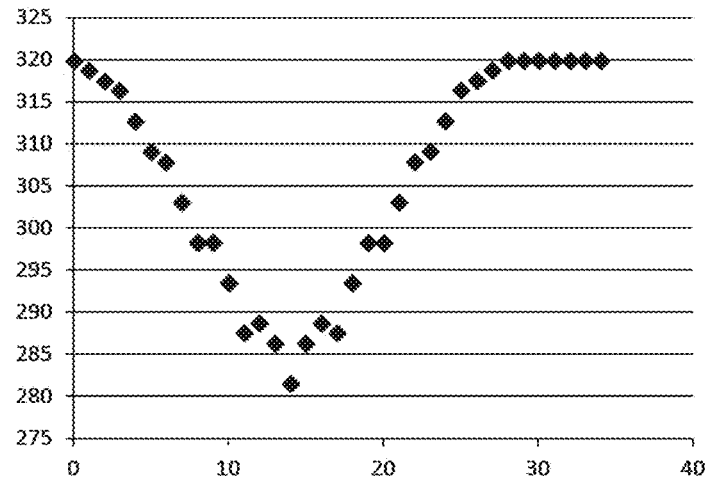
FIG. 13 is a graph showing a result of weighting and addition of a graph different in peak interval from FIGS. 11 and 12.
Figure 14:
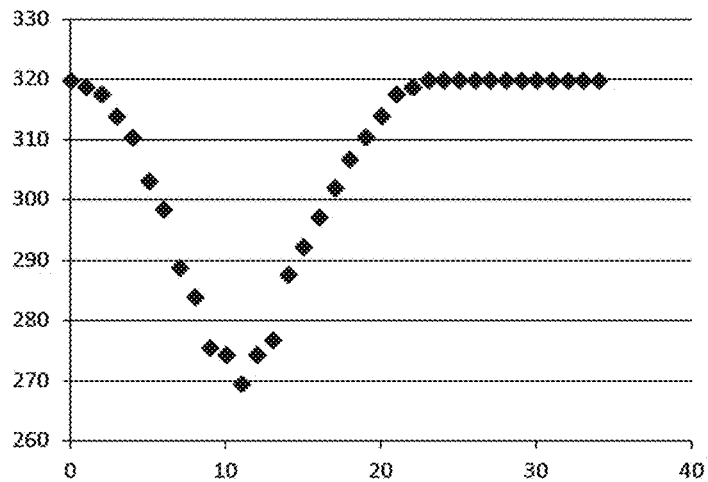
FIG. 14 is a graph showing a result of weighting and addition of a graph different in peak interval from FIGS. 11 to 13.
Figure 15:
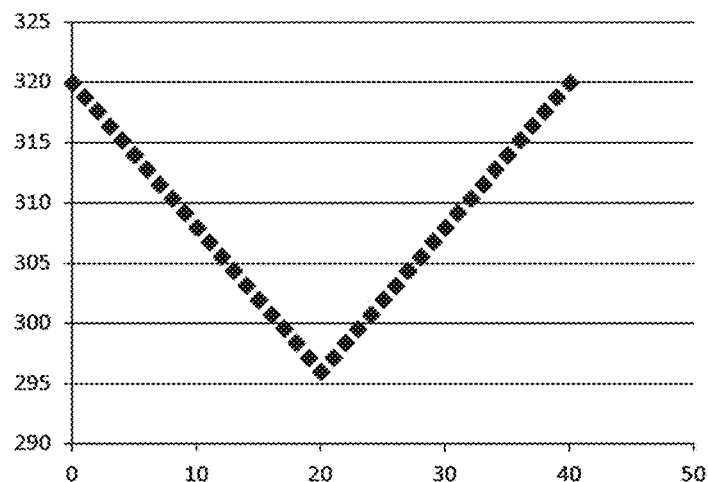
FIG. 15 is a graph showing a result of weighting and addition of a graph different in peak interval from FIGS. 11 to 14.
Figure 16:
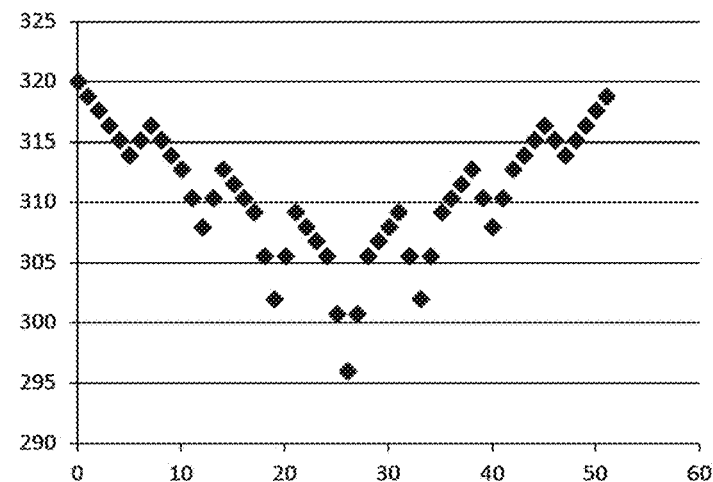
FIG. 16 is a graph showing a result of weighting and addition of a graph different in peak interval from FIGS. 11 to 15.

FIG. 12 shows a graph obtained by weighting and addition of seven profiles shown in FIG. 11, with the seven profiles being provided as the premises. Weights for first to seventh profiles are set to "2", "4", "6", "8", "6", "4", and "2", respectively, and weighted fluorescence intensity $P_w$ is calculated as $P_w=2P_1+4P_2+6P_3+8P_4+6P_5+4P_6+2P_7$, with $P_1$ to $P_7$ representing fluorescence intensities of the first to seventh profiles, respectively.

FIGS. 13 to 16 show graphs of results of calculation of fluorescence intensity $P_w$ weighted similarly to the above, of a profile in which a half-value width of each valley is fixed to "5" and an interval between adjacent valleys is different from "4". FIGS. 13 to 16 show results in examples in which intervals between adjacent valleys of the seven profiles are set to "3", "2", "5", and "7", respectively. As can be seen in FIGS. 12 to 15, a waveform having one wide valley can be obtained by weighting a profile of fluorescence intensity and adding the same. When the half-value width of the valley is equal to an interval between adjacent valleys (FIG. 15), one valley defined by a monotonously decreasing value and a monotonously increasing value and having one relative minimum value is obtained. When the half-value width of the valley is larger than an interval between adjacent valleys (FIGS. 12 to 14), one valley defined by a value which does not monotonously decrease but substantially monotonously decreases and a value which does not monotonously increase but substantially monotonously increases is obtained. When the half-value width of the valley is smaller than an interval between adjacent valleys (FIG. 16) as well, substantially one valley is obtained, although it is not clearly defined.

Therefore, a numeric value of a microwave frequency can be determined based on a numeric value of a total of all fluorescence intensities. When a half-value width of the valley in each $NV^-$ center region is smaller than an interval between relative minimum values in each $NV^-$ center region (see FIG. 16), accuracy in determination of a numeric value of a microwave frequency based on a numeric value of the total of all fluorescence intensities is lowered. Determination can be made, however, if accuracy equal to or lower than this accuracy is allowable. Therefore, no problem arises even though a half-value width of the valley is smaller than an interval between adjacent valleys.

It can be estimated from the result of simulation above that a large valley over a width of ΔFe shown in FIG. 8 is obtained when excitation light is emitted to all of the plurality of $NV^-$ center regions and fluorescence from all of them is simultaneously received. Minor irregularities are ignorable. Then, whether region a or region b mainly contributes to fluorescence intensity can be determined based on fluorescence intensity thereof. With sacrifice of accuracy in microwave frequency (accuracy in magnetism intensity), without light reception elements in an array, one can know from which region a value of a microwave frequency (a value of magnetism intensity) originates.

Though a method of simultaneous collective measurement of a plurality of $NV^-$ center regions is thus lower in sensitivity to magnetic field than measurement only of an individual $NV^-$ center region, a range of measurement (range) of magnitude of magnetic field can be broadened. Therefore, it is effective in terms of measurement of variation in large magnetic field. An object to be measured includes preferably at least one thousand $NV^-$ center regions, more preferably at least ten thousand $NV^-$ center regions, and further preferably at least one hundred and sixty thousand $NV^-$ center regions. As the number of regions is larger, the entire curve is smoother. Since an effect thereof is in proportion to a square root of the number, sensitivity is improved by orders of magnitude. As in the present method, in a test sample prepared to allow collective measurement, two relative minimum values of a profile representing a result of collective measurement (a graph of fluorescence intensity representing frequency dependency of microwaves) are preferably observed owing also to an effect of its own set magnetic field. When there is a single relative minimum value, with application of external magnetic field, the relative minimum value is consequently split into two values, which reflect different states between the initial state and a state of application of external magnetic field, and analysis becomes complicated. Therefore, a relative minimum value of fluorescence intensity is preferably initially split into two values while there is no external magnetic field being applied.

(Mechanism for Eliminating Ambient Magnetic Field)

Though the first to third embodiments are described above, in actual measurement of magnetism, various magnetic fields are present other than magnetic field to be detected, which interfere detection of weak magnetism. Such magnetic field originates from magnetism of the earth, magnetism originating from a current or the like of an apparatus, and spatial field such as radio waves, and these magnetic fields other than magnetic field of interest of measurement are collectively called ambient magnetic field. In using the diamond magnetic sensor according to the first to third embodiments, elimination of ambient magnetic field is demanded in order to measure only magnetic field to be detected. In order to eliminate ambient magnetic field, shield against ambient magnetic field and cancellation of ambient magnetic field are possible.

In order to cut off ambient magnetic field, a magnetic shield is effective. Magnetism is preferably prevented from entering a position of the sensor, for example, by arranging a soft magnetic material high in permeability such as Permalloy around the diamond magnetic sensor as a method of eliminating all ambient magnetic fields. It is possible to provide a sealed space by using a member with such a shielding effect or to eliminate magnetic field by using the Meissner effect of a superconducting material.

Only magnetic field to be a signal to be detected is guided to a sensor while all ambient magnetic fields are thus eliminated. When magnetic field to be detected is fluctuating magnetic field high in frequency, an antenna can be arranged in the inside of the magnetic shield so that fluctuation in current can be introduced into the inside of the magnetic shield through the antenna.

A cancellation coil is also preferably used as a method of canceling ambient magnetic field. The cancellation coil serves to set ambient magnetic field ideally to zero by generating magnetic field reverse in orientation to the ambient magnetic field in the sensor (which is also referred to as cancellation magnetic field below). It is difficult to cancel all ambient magnetic fields with cancellation magnetic field. Cancellation to some extent can be achieved, however, by reversing a specific magnetism pattern assumed in advance or a magnetism pattern separately detected in the vicinity of the sensor to generate cancelation magnetic field. For example, it is relatively easy to cancel only alternating-current (AC) magnetic field having a specific frequency. It is also possible to cancel a magnetic field pattern at a frequency equal to or lower than a frequency including a main magnetic field pattern in an environment and not to cancel a magnetic field pattern at a higher frequency including a magnetic field pattern to be sensed. A method of generating magnetic field by forming double coils of a cancelation coil and an introduction coil, canceling all magnetic field patterns with the cancellation coil, and introducing only a frequency of a magnetic field pattern around a frequency including a sensing signal through the introduction coil as an antenna can also be selected.

A direction of magnetic field can be detected by using a plurality of $NV^-$ centers in diamond different in direction. With this function, ambient magnetic field may be canceled. Magnetic field to be measured is often different also in orientation from ambient magnetic field. Since $NV^-$ centers in diamond can be designed to have a sensor for detecting magnetic fields in four orientations, an orientation and magnitude of magnetic field can be sensed. By outputting magnitude and an orientation of magnetic field perpendicular to ambient magnetic field, information on cancellation of ambient magnetic field can be obtained.

It is difficult to thus reduce ambient magnetic field completely to zero. By minimizing ambient magnetic field, however, an effect of elimination of ambient magnetic field by a method which will be described later can be enhanced.

(Diamond Magnetic Sensor Module)

The diamond magnetic sensor according to the first to third embodiments is preferably configured as a diamond magnetic sensor module in which components are arranged on a single circuit board directly or with another member being interposed. Diamond, a microwave generator, an excitation light generator, and a fluorescence sensor or a fluorescence sensor array are mounted on a single circuit board, and power supply and signal wiring are implemented by a wiring pattern on the circuit board.

Figure 17A:
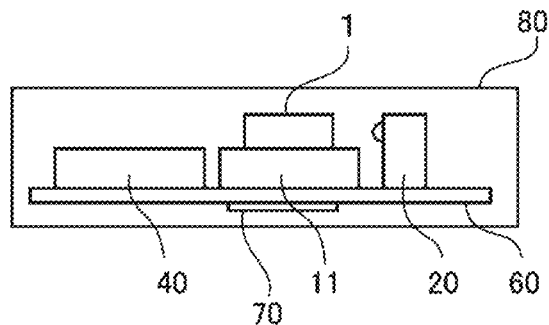
FIG. 17A is a side view showing an example of a configuration of the diamond magnetic sensor according to the first embodiment, as being mounted as a module on a single circuit board.
Figure 17B:
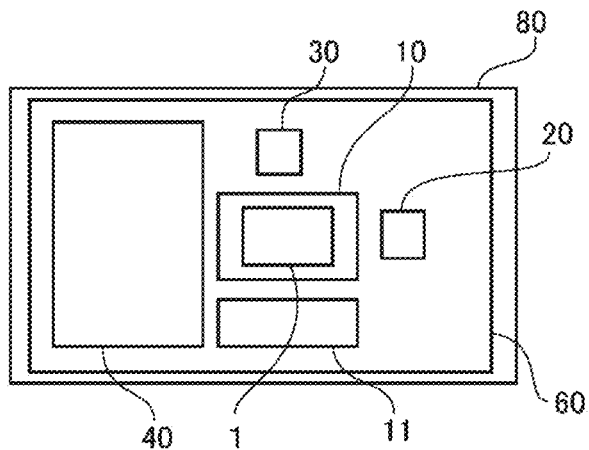
FIG. 17B is a plan view showing the example of the configuration of the diamond magnetic sensor according to the first embodiment, as being mounted as the module on the single circuit board.

FIGS. 17A and 17B are schematic diagrams each showing an example of a configuration on a single circuit board, of the diamond magnetic sensor according to the first embodiment shown in FIG. 1 as a module. FIG. 17A is a side view along a direction of the main surface of the circuit board and FIG. 17B is a plan view in a direction perpendicular to the main surface of the circuit board. Both of the figures show only a frame of a magnetic shield member 80 and the inside of the magnetic shield member can be seen through. The circuit board refers to a rigid or flexible board which is called a printed board and includes electric wires on a surface or in the inside. Microwave generation source 10, frequency sweep apparatus 11, excitation light generator 20, fluorescence sensor 30, and pattern measurement apparatus 40 implemented by a microprocessor are arranged on one surface of a circuit board 60, and they are connected through a wiring pattern on the circuit board. Diamond 1 is arranged on microwave generation source 10 in this example. Though other electric components and optical components such as a lens are not shown, they are arranged as necessary. This arrangement is merely by way of example and limitation to arrangement shown in FIGS. 17A and 17B is not intended.

A cancellation coil 70 is provided at a location corresponding to diamond 1 on a rear surface of circuit board 60. Though cancellation coil 70 is not essential, cancellation coil 70 can cancel desired magnetic field. Cancellation coil 70 can be formed as a printed wire on circuit board 60, and formation as such obviates the need for a separate coil component and space efficiency is preferably good.

The entire circuit board on which components are thus mounted is covered with magnetic shield member 80. Though magnetic shield member 80 is not essential, ambient magnetic field can be cut off by magnetic shield member 80. Measurement can be conducted by providing an opening in a part of magnetic shield member 80 and bringing magnetism to be measured closer or guiding magnetic field to the opening. Alternatively, if an object to be measured itself can be placed in the inside of magnetic shield member 80 without providing an opening, such a form of arrangement is desirable. Magnetic field can also be introduced as a current by providing an antenna (not shown) in the inside of magnetic shield member 80, without providing an opening.

Figure 18A:
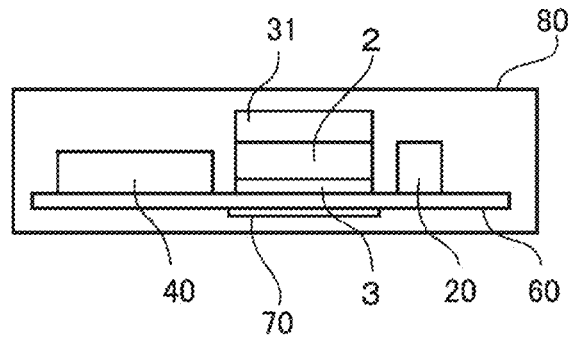
FIG. 18A is a side view showing an example of a configuration of the diamond magnetic sensor according to the second embodiment, as being mounted as a module on a single circuit board.
Figure 18B:
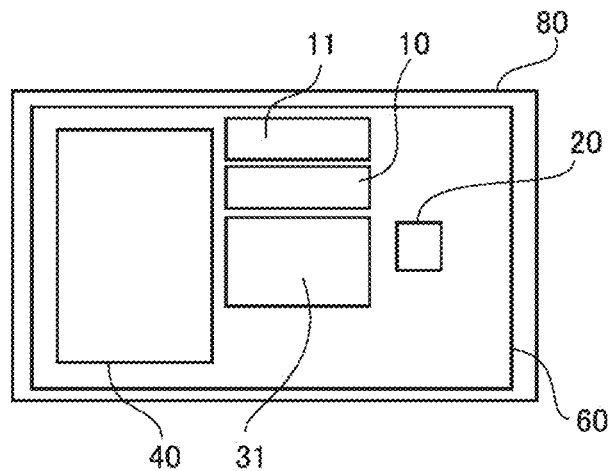
FIG. 18B is a plan view showing the example of the configuration of the diamond magnetic sensor according to the second embodiment, as being mounted as the module on the single circuit board.

FIGS. 18A and 18B are schematic diagrams each showing an example in which the diamond magnetic sensor according to the second embodiment shown in FIG. 6 is configured on a single circuit board as a module. FIG. 18A is a side view along a direction of the main surface of the circuit board and FIG. 18B is a plan view in a direction perpendicular to the main surface of the circuit board. Microwave generation source 10, frequency sweep apparatus 11, excitation light generator 20, and pattern measurement apparatus 40 implemented by a microprocessor are arranged on one surface of circuit board 60. Diamond 2 is arranged on circuit board 60 as a stack together with magnetic array 3 and fluorescence sensor array 31. The components are connected by a wiring pattern or an individual wire on circuit board 60. Though other electric components and optical components such as a lens are not shown, they are arranged as necessary. This arrangement is merely by way of example and limitation to arrangement shown in FIGS. 18A and 18B is not intended.

Cancellation coil 70 and magnetic shield member 80 are the same as in FIGS. 17A and 17B.

A drive circuit for each component and an auxiliary circuit in connection with a power supply and additionally a processor for signal processing can also be arranged on the same circuit board. A mounted electric circuit, however, may be a source of magnetic noise. Therefore, extra electric circuits and wires are preferably as few as possible. If possible, the entire module or only a portion around diamond serving as a sensor portion is preferably covered with a magnetic shield or configured such that ambient magnetic field is eliminated therefrom by a cancellation coil. A configuration of a diamond magnetic sensor as a module on a single circuit board as such is preferred in terms of elimination of ambient magnetic field or a compact size and ease in arrangement thereof in close proximity to an object to be detected such as a living body.

The configuration of the sensor as a whole is thus compact. Improvement in reliability of the sensor such as a stabilized optical axis, improved efficiency in irradiation with excitation light and irradiation with microwaves, and enhanced stability of a position of irradiation is achieved.

(Sensor Portion Detachable Diamond Magnetic Sensor Module)

It is effective to space diamond 1 (FIG. 1) or diamond 2 (FIG. 6) serving as a sensing portion spatially away from another electronic circuit (an electronic circuit for generating excitation light, an electronic circuit of a fluorescence reception portion, and an electronic circuit for generating microwaves) portion in a diamond magnetic sensor. For diamond 2, however, such arrangement is limited to an experimental layout without a proximate light reception element array. This is because the sensing portion is desirably brought closer to a portion where magnetism is desirably sensed, and this is effective in proportion to a square or a cube of a distance, without depending on sensitivity of a sensor. Even when there is no enough space, only a small sensing portion can also be arranged and a degree of freedom of a sensing module or a sensing system is also enhanced. In terms of elimination of weak magnetic field generated from other electronic circuit portions as much as possible, an apparatus having such a structure that diamond is spaced apart from other circuits physically and spatially can be provided. Influence of unnecessary magnetic field onto the diamond magnetic sensor can thus be eliminated. In order to achieve this, it is important that laser beams readily emitted even from a considerable distance are adopted as excitation light. It has been found that use of a panopticon or a telelens is effective for light reception. It has been found effective also to provide a lens around the sensing portion of diamond. A lens which is made of an insulator and has not been degraded is essential as a lens to be brought closer, as in the case of diamond. In an example where such a lens of a microscopic type is arranged, a light reception portion magnifies diamond located far and a light reception element array can also be provided as a light reception portion. It is also important to facilitate emission of microwaves. Use of a parabolic antenna is effective and use of an oval spherical antenna is more effective. Efficiency is significantly higher by setting a portion for oscillating microwaves at a focus of the antenna and setting diamond to be irradiated therewith at another focus. A distance between the sensing portion of diamond and a closest portion such as an electronic circuit portion other than that or an antenna portion of a microwave oscillator is preferably not shorter than 10 cm, more preferably not shorter than 20 cm, and further preferably not shorter than 50 cm. When a high voltage is generated around a diamond portion and the closest portion is located nearby, a person who is conducting measurement and a measurement instrument are affected by discharging from a high voltage portion to an immeasurable extent. An opening in each antenna has a diameter preferably not smaller than 15 cm, more preferably not smaller than 20 cm, and further preferably not smaller than 30 cm. This is because it becomes difficult to converge microwaves at one focus when a size of the opening is greater than a wavelength of microwaves.

The diamond magnetic sensor can be implemented as a module or an apparatus structured such that diamond serving as the sensing portion and other electronic circuit portions are spaced apart from each other by a plate (glass or quartz) transparent to a visible light region or an infrared region and arranged in environments different from each other. Thus, magnetism in an environment where diamond is placed can be measured by using highly resistant diamond even in an environment against which an electronic circuit is not resistant (an acid environment, an alkali resistant environment, a corrosion resistant environment, a pressure environment, a high-temperature environment, and a high-humidity environment). The environment refers to an environment in a gas atmosphere or in a strong liquid such as water, acid, and alkali. It is very difficult for other sensing materials to obtain high reliability in such an environment.

Noise caused by the electronic circuit portion is significantly lowered at a distance by at least 1 cm from the electronic circuit portion. Therefore, diamond and the electronic circuit portion are preferably spaced apart from each other by at least 1 cm. A distance therebetween is more preferably not shorter than 2 cm and further preferably not shorter than 5 cm.

(Resolved Analysis of Ambient Magnetic Field)

Since the diamond magnetic sensor according to the first to third embodiments is able to measure a temporal change pattern of magnetism intensity, it can detect based on the temporal change pattern, small magnetic field with influence by ambient magnetic field being excluded. For example, when a pattern including a plurality of AC magnetic fields is present as ambient magnetic field, magnetic field less than 1/10 of largest magnetic field in the magnetic field pattern having largest magnetic field among them can be sensed as being separated and extracted.

Figure 19:
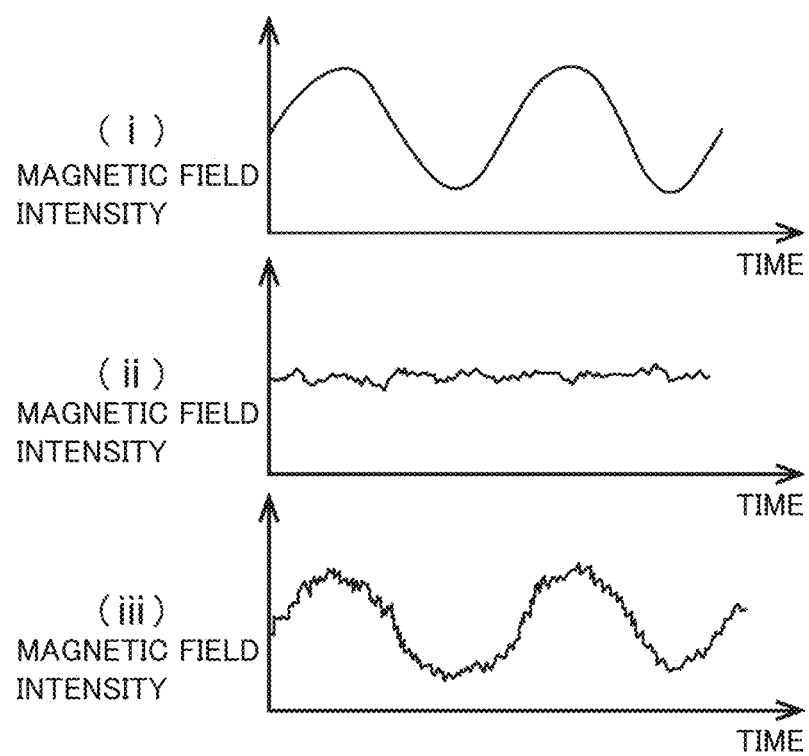
FIG. 19 is a graph for illustrating measurement of ambient magnetic field and magnetic field to be sensed as being combined.

FIG. 19 is a graph showing ambient magnetic field and magnetic field to be sensed as being combined. Resolved analysis of ambient magnetic field will be described with reference to FIG. 19. In FIG. 19, a graph in (i) shows AC magnetic field as ambient magnetic field, with the abscissa representing time and the ordinate representing magnetic field intensity. A graph in (ii) shows signal magnetic field to be measured and represents fluctuation higher in frequency and weaker than ambient magnetic field. A graph in (iii) shows a temporal change pattern as a result of actual measurement by the pattern measurement apparatus. A signal in (iii) results from combination of the signal in (i) representing ambient magnetic field and the signal in (ii) representing signal magnetic field. For the sake of brevity of description, it is assumed that no magnetic field other than these is present in a measurement environment.

A temporal pattern (i) of ambient magnetic field is obtained by measurement in the absence of an object to be measured. A frequency component of ambient magnetic field is found by frequency analysis of data measured in advance. The found frequency is denoted as f0. Though description about a single frequency is given in the present example, a plurality of frequency components are desirably found when a plurality of components are superimposed on one another.

One method of separating and extracting the signal (ii) from the measured temporal change pattern (iii) is filtering. When a signal is analog, a high-pass filter which filters out a signal not higher than frequency f0 can be employed. The signal (ii) can be obtained by filtering the signal (iii). The temporal change pattern is generally obtained as a data string of digitally processed discrete values in an actual apparatus. In this example as well, the signal (ii) can be obtained by implementing an arbitrary filter by using an already known digital filtering technique.

Effective filtering in an example where a plurality of frequencies are present as being mixed is achieved by using Fourier analysis. By subjecting the measured temporal change pattern (iii) to digital Fourier transform, the temporal change pattern can be separated into frequency components, and a frequency component specified in advance as ambient magnetic field or an assumed frequency component among the frequency components should only be excluded. By converting the excluded signal back to the temporal change pattern with a reverse Fourier transform approach, the signal (ii) can be obtained. Other signal processing means such as a method of making use of an auto-correlation function of the signal may be employed.

Though description is given above with AC magnetic field being assumed as ambient magnetic field, much noise can also be understood as superimposition of AC magnetic fields. Ambient magnetic field containing broad frequency components such as white noise can also be separated. A signal to be measured can be taken out by analyzing a frequency component included in a measured temporal change pattern and extracting and separating a signal component different from a noise component investigated and analyzed in advance. Thus, according to the diamond magnetic sensor in the present application, a temporal change pattern of magnetism intensity can be obtained and weak magnetic field can efficiently be measured with ambient magnetic field being eliminated.

(Analysis of Temporal Change Pattern by Using Intermittent Data)

Continuous measurement of a temporal change pattern of magnetic field is effective for analyzing data. Even though actual variation in magnetic field goes beyond a measurable range to lead to failure in obtaining continuous data and success in obtaining only intermittent data, a temporal change pattern within the measurable range can help estimation outside the measurable range. If a temporal change pattern is predicted or has already been known, general outlines can be obtained based on values obtained within the measurable range in consideration of the temporal change pattern also inclusive of the outside of the measurable range. Specifically, if the temporal change pattern has been known to consist of sine waves, cosine waves, or triangular waves, a phase and a maximum value can be calculated based on values of some of them. This is also applicable to each of the first to third embodiments.

Preferred Manner of the Present Invention

Another preferred manner of the present invention is additionally described below.

(Additional Aspect 1)

A diamond magnetic sensor including diamond containing at least two NV$^-$ centers different in direction of N—V bond, a microwave generator which emits microwaves to the diamond, an excitation light generator which emits excitation light to the NV⁻ centers of the diamond, a fluorescence sensor which individually receives fluorescence produced from the respective NV⁻ centers of the diamond different in direction of N—V bond, and a pattern measurement apparatus which measures a pattern of variation in magnetic field intensity and azimuth of magnetic field based on variation in intensity of individual fluorescence.

(Additional Aspect 2)

The diamond magnetic sensor described in additional aspect 1, in which the pattern measurement apparatus measures a spatial direction pattern of the magnetic field intensity based on a spatial distribution of fluorescence intensity corresponding to a spatial distribution of each NV⁻ center.

(Additional Aspect 3)

The diamond magnetic sensor described in additional aspect 1, in which the pattern measurement apparatus measures a spatial direction pattern of the magnetic field intensity based on a spatial distribution of fluorescence intensity corresponding to a spatial distribution of each NV⁻ center and a temporal change pattern of the magnetic field intensity based on fluorescence intensity of each NV⁻ center.

(Additional Aspect 4)

The diamond magnetic sensor described in any one of additional aspects 1 to 3, in which the pattern measurement apparatus performs a function to control sweep of a frequency of the microwaves, a function to specify the frequency of the microwaves at which a relative minimum value of the fluorescence intensity is produced, and a function to detect magnetic field intensity based on the specified frequency, and measures a temporal change pattern of magnetism intensity corresponding to each NV⁻ center by repeating detection of the magnetic field intensity by repeating sweep of the frequency.

(Additional Aspect 5)

The diamond magnetic sensor described in any one of additional aspects 1 to 4, the diamond magnetic sensor further including a data analysis apparatus which separates intensity of magnetic field originating from a measurement environment and intensity of magnetic field originating from an object to be measured from each other based on the spatial direction pattern.

(Additional Aspect 6)

A diamond magnetic sensor including diamond containing at least one NV⁻ center, a microwave generator which emits microwaves to the diamond, an excitation light generator which emits excitation light to the NV⁻ center of the diamond, a fluorescence sensor which receives fluorescence produced from the NV⁻ center of the diamond, and a pattern measurement apparatus which measures a temporal change pattern of magnetic field intensity based on variation in fluorescence intensity sensed by the fluorescence sensor, the microwave generator generating a combined wave of a microwave having a desired frequency width and a microwave resulting from phase shift of the microwaves, the pattern measurement apparatus measuring a temporal change pattern of the magnetic field intensity with a function to control sweep of an amount of phase shift of the combined wave, by repeating detection of the magnetic field intensity by repeating sweep of the amount of phase shift.

EXAMPLES

Results of experiments are shown below.
(Preparation of Sample for Sensor)
Samples A to D of single-crystal diamond as below were initially prepared.

(1) Sample A

Sample A was prepared by manufacturing single-crystal diamond containing at most 0.1 ppm of substitutional nitrogen by a high-temperature and high-pressure method. In manufacturing, a sample containing a small amount of nitrogen was obtained by adding a metal serving as a nitrogen getter to a solvent.

(2) Sample B

Sample B was prepared by manufacturing single-crystal diamond controlled to contain 60 ppm of substitutional nitrogen by a high-temperature and high-pressure method. In manufacturing, a uniform sample of which uniformity of impurities was within ±25% was obtained by controlling a concentration of nitrogen by a method of eliminating nitrogen naturally introduced into a solvent and adding a nitride (for example, FeN) to the solvent.

(3) Sample C

Sample C was prepared by manufacturing CVD single-crystal diamond containing at most 20 ppb of nitrogen and at most 1 ppb of substitutional nitrogen by employing sample A of single-crystal diamond in (1) as a seed substrate and epitaxially growing diamond with CVD. In manufacturing, for reducing a nitrogen impurity and other impurities, not only a high-purity seed substrate was employed but also such schemes as addition of an appropriate amount of oxygen atoms and paving of an area extending by +30 mm around a holder with a high-purity diamond plate material were adopted.

(4) Samples D1 and D2

Samples A, B, and C were made of diamond containing isotopic carbon at a natural abundance ratio. On the other hand, samples D1 and D2 were prepared by manufacturing by a high-temperature and high-pressure method, single-crystal diamond containing 50 ppm and 100 ppm of substitutional nitrogen, respectively, and containing $^{13}C$ at an abundance ratio of 5%. The samples were uniform, with uniformity of impurities being within ±25%.

As a result of evaluation of a concentration of nitrogen contained in samples A, B, C, D1, and D2 of single-crystal diamond with SIMS analysis, the concentration of substitutional nitrogen substantially matched with contained nitrogen. The concentration of substitutional nitrogen in sample C made of single-crystal diamond was substituted with a total of a density of NV⁻ light emission centers and a density of NV⁰ light emission centers. Since the concentration of nitrogen was low and vacancies were sufficiently introduced, it could be estimated that there was no difference by orders of magnitude. Each of samples A, B, and C is a concentration in a measured portion. Vacancies (V) were introduced by electron beam irradiation (irradiation conditions including energy of 4 MeV and a radiation dose of 20 MGy), and bonded to substitutional nitrogen in subsequent annealing (three hours at 1600° C.). Formation of NV⁻ centers was confirmed based on photoluminescence. In samples A and C, an NV⁻ center as being isolated alone could be observed. In samples B, D1, and D2, innumerable aggregates of NV⁻ centers could be observed.

Samples E and F as below were manufactured.

(5) Samples E1 and E2

Figure 20:
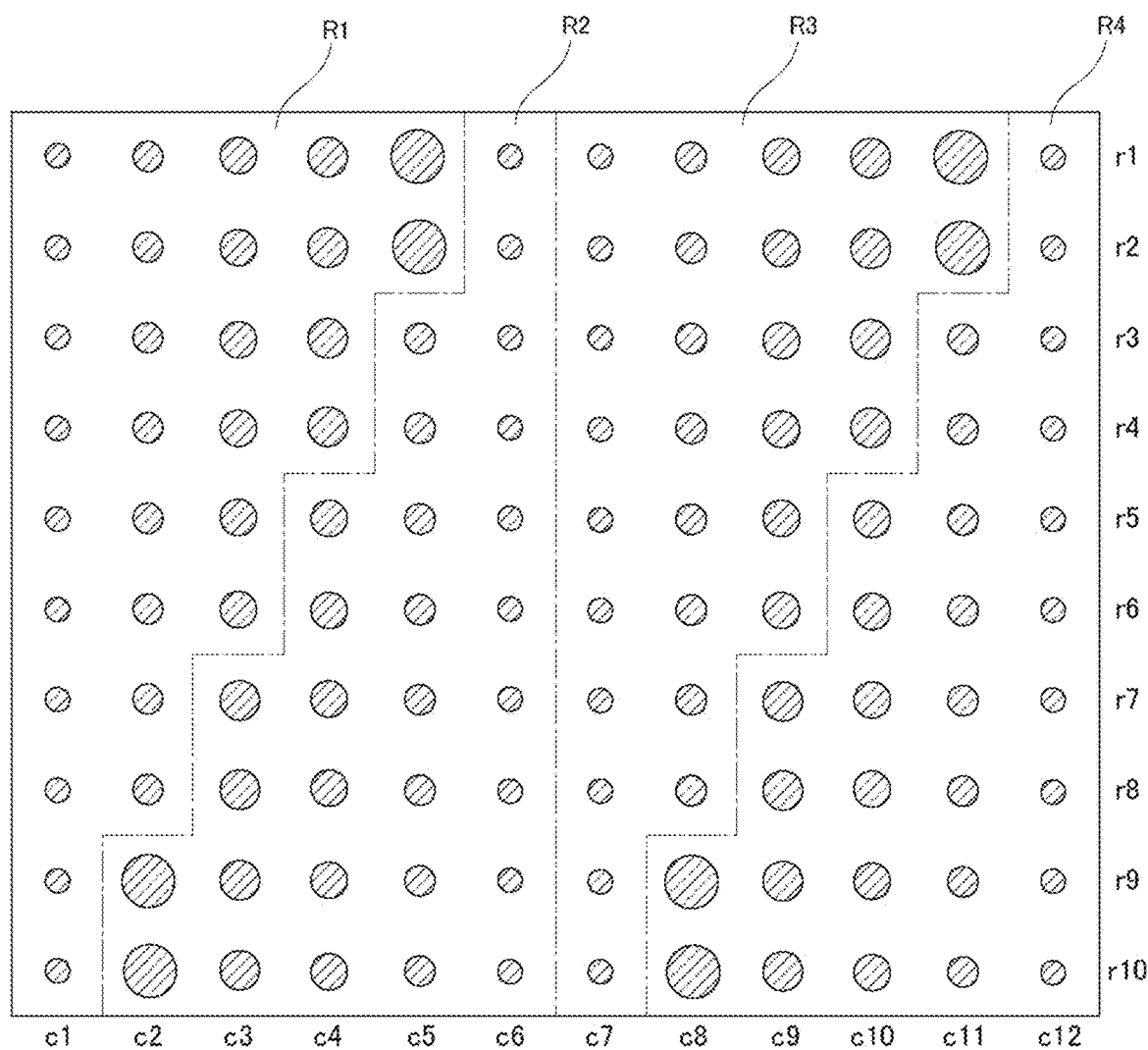
FIG. 20 is a plan view showing a prototyped sample E.

A sample which contained NV⁻ centers substantially comparable to those in sample B was initially manufactured, and a rear surface thereof was polished to 100 μm and further etched by reactive ion etching to a final thickness of 70 μm. An array of dots having diameters of approximately 5, 8, 13, 20, and 30 μm was formed in lattices at an interval of 200 μm by vapor depositing Fe on the rear surface to a thickness of 2 μm. The Fe dots were prepared at a number ratio of approximately 10:8:6:4:2. FIG. 20 schematically shows arrangement of Fe dots (hatched portions). In a region R1 among four regions R1 to R4 delimited by a chain dotted line, dots in a column c1 and rows r1 to r10 were formed to approximately 5 µm φ, dots in a column c2 and rows r1 to r8 were formed to approximately 8 µm φ, dots in a column c3 and rows r3 to r6 were formed to approximately 13 µm φ, dots in a column c4 and rows r1 to r4 were formed to approximately 20 µm φ, and dots in a column c5 and rows r1 to r2 were formed to approximately 30 µm φ. Arrangement of dots in a region R2 is obtained by turning region R1 by 180 degrees. Arrangement of dots in regions R3 and R4 is the same as in respective regions R1 and R2.

Then, an Al mask of 20 µm φ was made in lattices at an interval of 200 µm on a front surface side with photolithography and diamond including NV⁻ centers was etched (a depth of etching being set to 40 µm). The sample including the etched portion as it was adopted as a member for manufacturing sample E1. The sample in which the etched portion was again buried by epitaxial growth was manufactured, and adopted as a member for manufacturing sample E2. Since a position of the Al mask was substantially accurately matched with a position where Fe dot array was formed on the rear surface, a member for manufacturing sample E1 in which small columnar diamond including NV⁻ centers was located on the Fe dot array and a member for manufacturing sample E2 in which portions including NV⁻ centers were scattered over the Fe dot array could be manufactured. Finally, sample E1 including NV⁻ centers different in magnetic field environment was manufactured by magnetizing Fe in the member for manufacturing sample E1. Sample E2 including NV⁻ centers different in magnetic field environment was manufactured by magnetizing Fe in the member for manufacturing sample E2. Present samples E1 and E2 were each made into the diamond magnetic sensor including a magnetic array (a diamond substrate for a magnetic sensor).

(6) Sample F

A sample F was made by manufacturing an array including NV⁻ centers partially in lattices by a method substantially the same as that for sample E. Specifically, an array of NV⁻ centers was manufactured by drilling holes of 40 µm φ in lattices at an interval of 200 µm in a lead plate of 0.5 mm and introducing defects in lattices by emitting electron beams with the plate being adopted as a mask, instead of making NV⁻ centers all over in a step of preparing a sample similar to sample B. Other features such as a method of forming a magnetic array (Fe array) on the rear surface are the same as in manufacturing sample E.

Example 1

Figure 21:
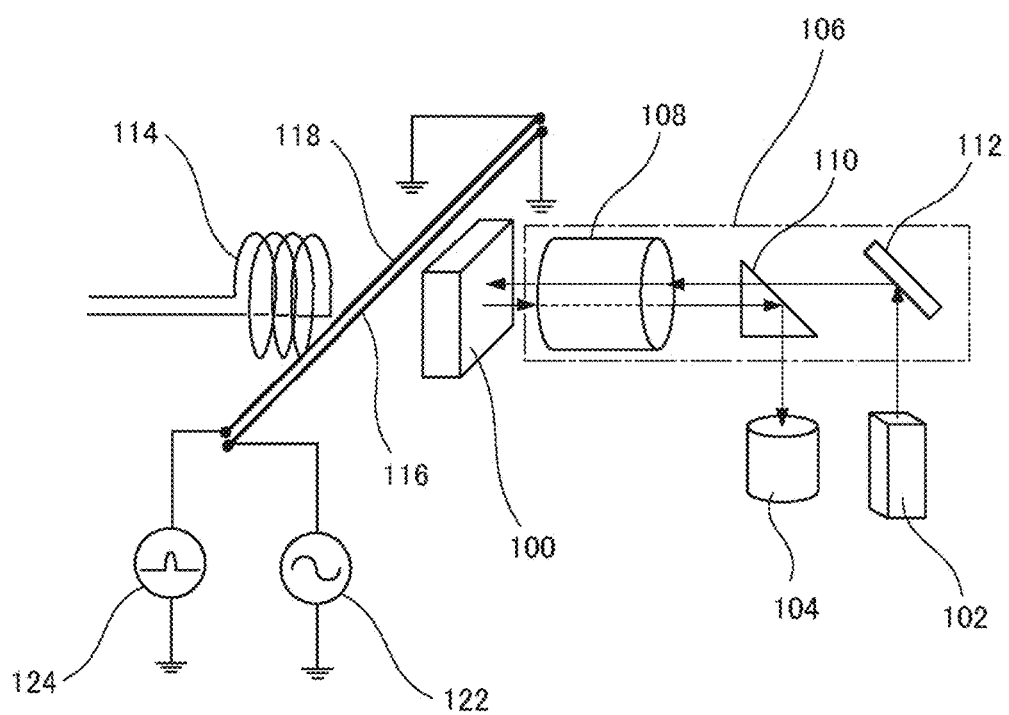
FIG. 21 is a schematic diagram showing a configuration of an apparatus used in Example 1.

An experimental apparatus configured as shown in FIG. 21 was manufactured and an experiment was conducted by using each of samples A and C of diamond. GaN-based semiconductor laser (a laser light source 102) which outputted green laser beams (having a wavelength of 520 nm) serving as excitation light, a microwave generator, and a semiconductor light reception element 104 were prepared as a measurement system. Laser beams and fluorescence to be observed were transmitted through an optical lens system 106 (including a microscope lens 108, a triangular prism 110, and a reflector 112). The microwave generator is capable of sweeping a frequency around 2.87 GHz. An antenna in a form of a solenoid coil (a microwave coil 114) was prototyped and set at a distance of approximately 5 mm from the sample (diamond 100) to be able to emit microwaves.

Samples A and C were searched for a single fluorescent point by magnifying an image of a surface of each sample with the lens. What was closest to the sample (diamond 100) was an objective lens and a distance therebetween was approximately 1 mm.

Then, an apparatus which generated a simulated magnetic waveform was prepared. A copper wire X 116 of 0.8 mm φ was prepared, and an AC current to be fed to copper wire X 116 by an AC current source 122 was controlled. AC was set to 60 Hz and a current value was set as appropriate. A copper wire Y 118 of 0.1 mm was arranged in proximity to and in parallel to copper wire X 116 so that a pulsed current could be fed from a pulsed power supply 124. The pulsed current was set to have a pulse interval of 60 Hz and a pulse width of 1 msec. Copper wire X 116 and copper wire Y 118 were arranged at a closest distance of 0.5 cm from samples A and C of diamond configured to perform sensing. AC current source 122 and pulsed power supply 124 implemented a simulation circuit for generating a simulating signal to be sensed.

An experiment as below was conducted as preparatory measurement. When samples A and C of diamond were irradiated with semiconductor laser beams having a wavelength of 520 nm while they were irradiated with microwaves with a constant direct-current (DC) current being fed to copper wire X 116, red fluorescence having a wavelength of approximately 638 nm was detected. When a frequency of microwaves was swept around 2.87 GHz, fluorescence exhibited two relative minimum values (valleys) at different frequencies (see FIG. 2). When a value of the current through copper wire X 116 was varied, a frequency interval between the two relative minimum values was varied. The frequency interval was substantially in proportion to the value of the current which flowed through copper wire X 116. Since the two relative minimum values were varied in symmetry, it could be confirmed that a temporal change pattern of a frequency of one relative minimum value could be converted to variation as a whole (the temporal change pattern of magnetism).

Then, main measurement was conducted. An AC current of 60 Hz (a highest current of 1.2 A) was fed to copper wire X 116. A current through copper wire Y 118 was zero. The experiment was conducted in a box free from influence by magnetism of the earth. The diamond was excited by the semiconductor laser and irradiated with microwaves, and a frequency of the microwaves was swept while intensity of red fluorescence at a wavelength of approximately 638 nm was measured. A relative minimum value was detected based on the obtained waveform of fluorescence intensity by sweeping the microwave frequency for a short period of time (a sweep period being not longer than 1 msec.), and a frequency corresponding thereto was stored. Thus, a temporal change pattern of the frequency corresponding to the relative minimum value was obtained. This temporal change pattern could be converted to a magnetism temporal change pattern. This part was performed by an apparatus which could obtain data on temporal change in microwave frequency corresponding to the relative minimum value and convert the data to a magnetism temporal change pattern.

Figure 22:
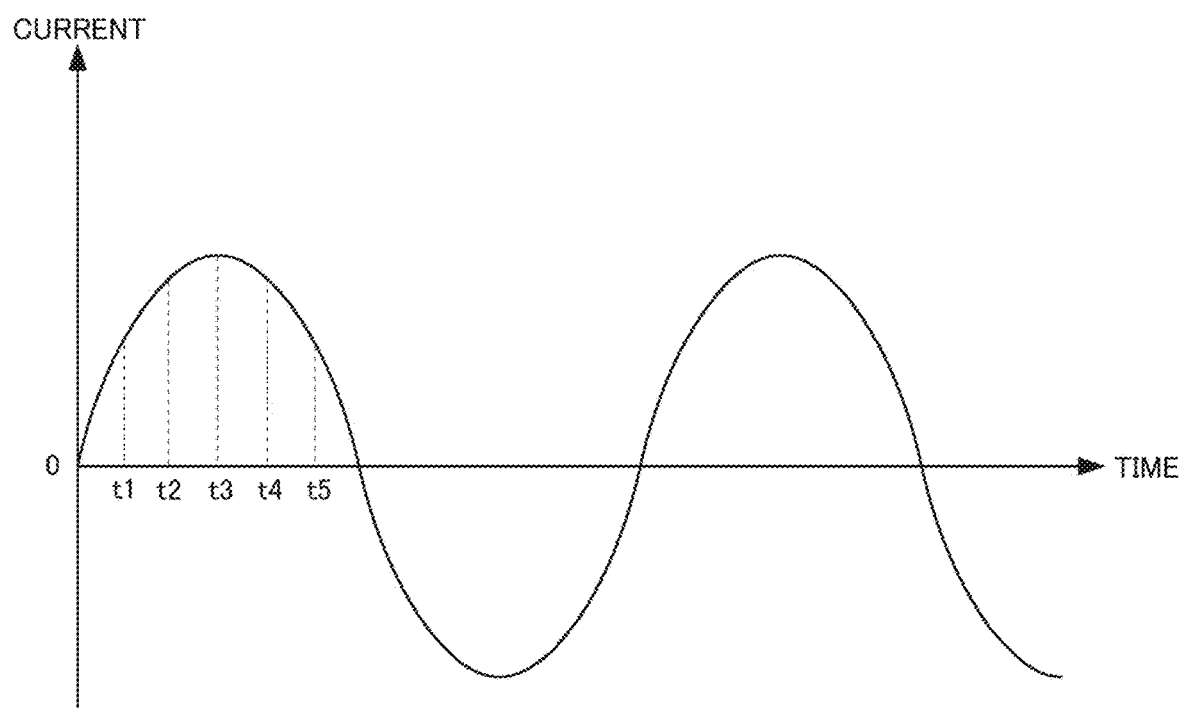
FIG. 22 is a graph showing a measurement condition in Example 1.
Figure 23:
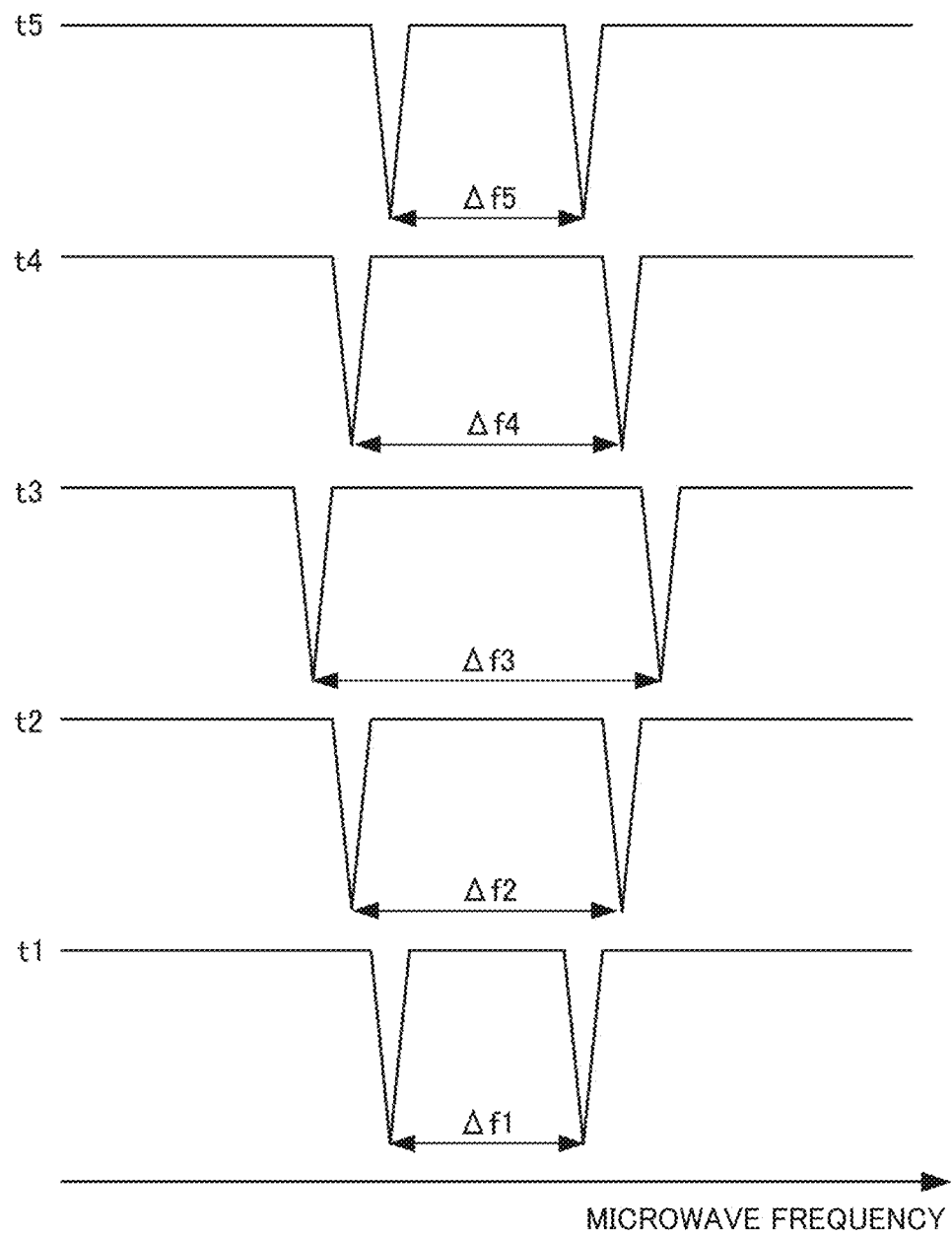
FIG. 23 is a graph schematically showing a result of measurement under the measurement condition in FIG. 22.

FIG. 22 shows a waveform of the AC current fed to copper wire X 116 which formed magnetic field. FIG. 23 shows a profile of obtained fluorescence intensity. FIG. 23 shows profiles measured at timings t1 to t5 in FIG. 22 as being aligned in the vertical direction with corresponding references being allotted. Though the vertical direction of each profile represents an axis of fluorescence intensity, the axis of fluorescence intensity is not in common but a flat portion in each profile exhibits substantially the same fluorescence intensity. Though FIG. 23 shows the profiles with solid lines, the solid line is actually a group of data at an interval of 1 msec. In this temporal change pattern, since intervals Δf1 to M5 between relative minimum values were varied with a cycle and a phase the same as those of the AC current at 60 Hz, the cycle and the phase of variation in magnetic field intensity could be obtained as information.

Figure 24:
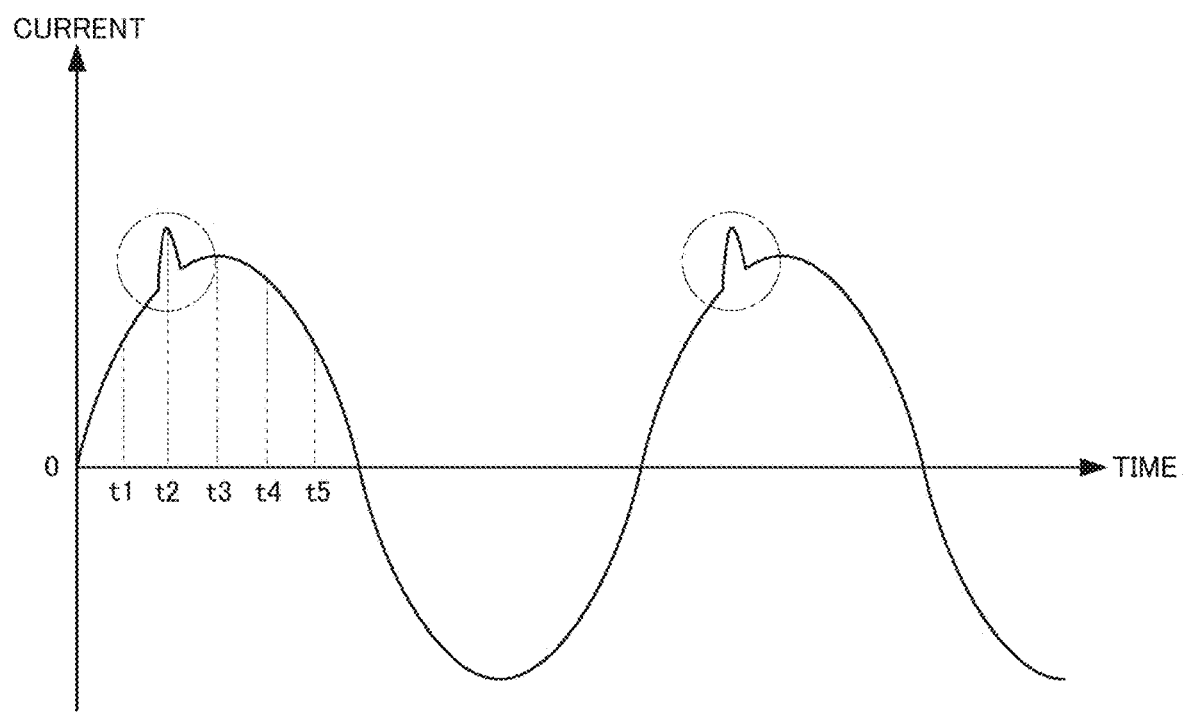
FIG. 24 is a graph showing a measurement condition different from that in FIG. 22 in Example 1.
Figure 25:
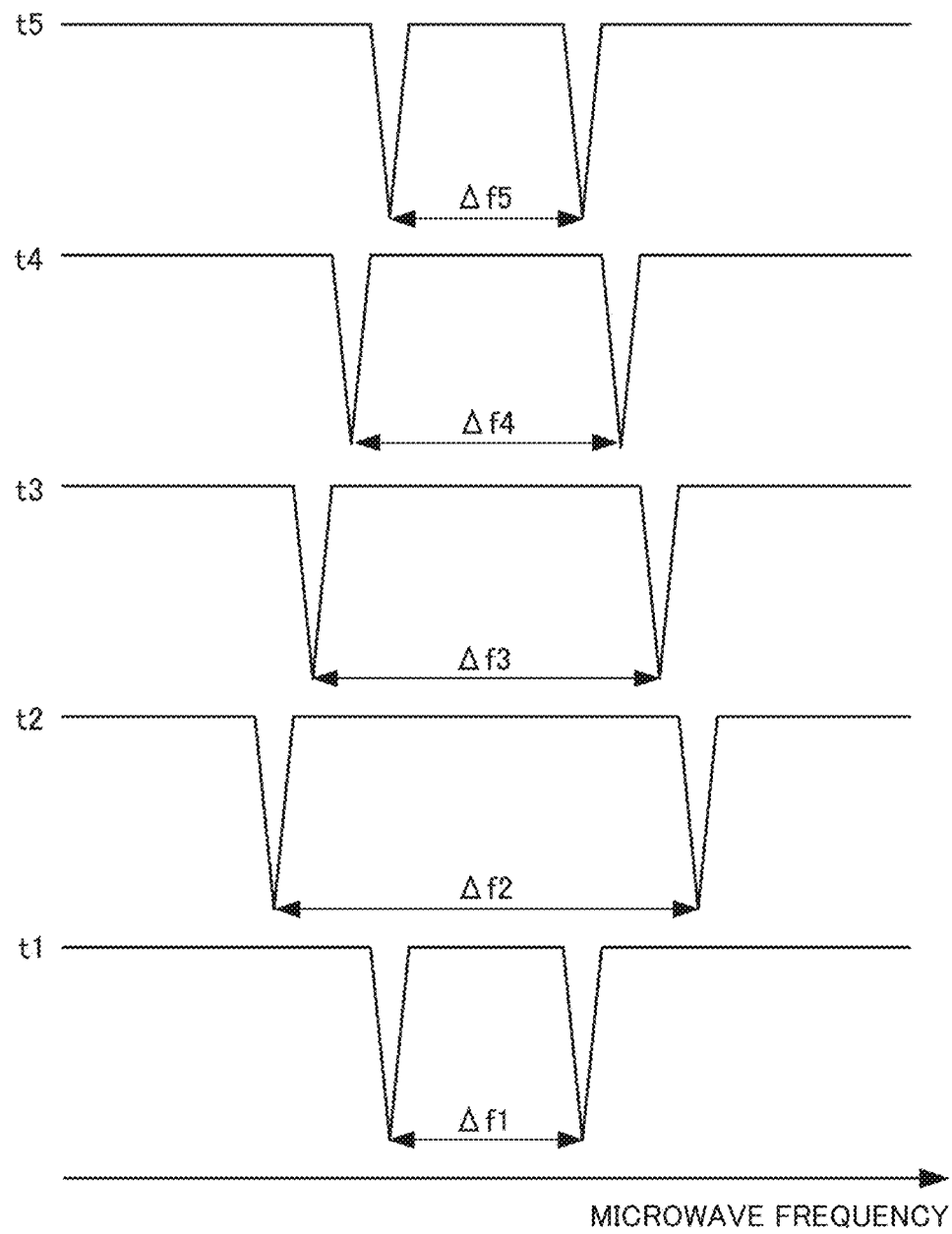
FIG. 25 is a graph schematically showing a result of measurement under the measurement condition in FIG. 24.

A pulsed current (having a maximum current value of 10 msec.) was fed to copper wire Y 118 while the AC current was fed to copper wire X 116. FIG. 24 schematically shows a combined waveform of the AC current fed to copper wire X 116 and the pulsed current fed to copper wire Y 118. A portion surrounded by a chain dotted line originates from the pulsed current fed to copper wire Y 118. Measurement was otherwise conducted under conditions the same as above. FIG. 25 shows a profile of obtained fluorescence intensity. FIG. 25 shows profiles measured at timings t1 to t5 in FIG. 24 as being aligned in the vertical direction with corresponding references being allotted as in FIG. 23. Though FIG. 25 shows the profiles with solid lines, the solid line is actually a group of data at an interval of 1 msec. A temporal change pattern was similarly obtained, and a result of measurement of a magnetism pattern of the AC current and a magnetism pattern of the pulsed current could be obtained.

Based on comparison between FIGS. 23 and 25, the interval between the relative minimum values (Δf1 and Δf3 to Δf5) of the profiles at t1 and t3 to t5 is equal between FIGS. 23 and 25, however, interval Δf2 between relative minimum values in the profile at t2 is greater in FIG. 25 than in FIG. 23. This is because the pulsed current was fed at timing t2 (see FIG. 24). Therefore, pulsed magnetic field generated in AC magnetic field can be detected based on variation in interval between relative minimum values. Thus, by setting a short cycle of sweep of a microwave frequency to 1 msec., small pulsed magnetic field could be detected even in large AC magnetic field, and the pulsed current could readily be determined by calculating a difference from the AC current by analyzing the temporal change pattern. Though analysis of the temporal change pattern could produce a result as a simple difference obtained by subtracting a high signal (AC signal) from copper wire X 116, the result was obtained also by analyzing a frequency of the temporal change pattern and cutting off a frequency of the high signal from copper wire X 116. Namely, a circuit configuration may be such that a high-pass filter may be incorporated in data processing. In this case, a frequency lower than 70 Hz was cut off (for eliminating 60 Hz which was a frequency of the AC current fed to copper wire X 116) and a frequency (1 kHz) equal to or higher than that was allowed to remain, which led to success.

Since the conventional diamond magnetic sensor mainly aimed to be high in sensitivity (to sense very small magnetic field), it suffered from overrange before measurement and at a time point when there was a little base magnetic field, and it was unable to know a waveform of a current which produced magnetic field, by sensing a temporal change pattern. According to one manner of the present invention, a rate of sweep of a frequency was raised and data was interpreted as a temporal change pattern. Therefore, a measurable range of magnetic field was significantly larger and even minor variation in magnetic field therein could be observed.

According to the present method, when a pulsed current higher in frequency component was to be detected, a frequency should be swept faster and finer. When a range of frequencies to be swept was broader, however, it was found efficient to trace only a valley as a single relative minimum value and to sweep a frequency around a relative minimum value expected based on time.

Example 2

Figure 26:
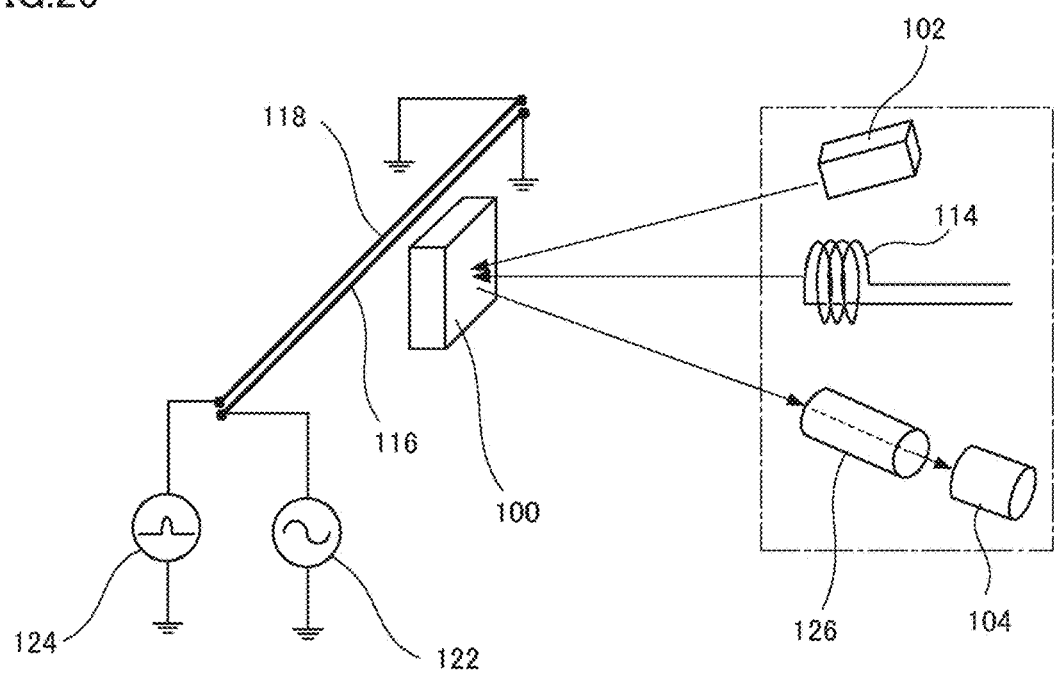
FIG. 26 is a schematic diagram showing a configuration of an apparatus used in Example 2.

An experimental apparatus configured as shown in FIG. 26 was manufactured and an experiment was conducted by using samples B, D1, and D2 of diamond. Semiconductor laser as excitation light (520 nm) (laser light source 102), the microwave generator, and semiconductor light reception element 104 the same as in Example 1 were prepared. For emitting microwaves, an antenna in a form of a solenoid coil (microwave coil 114) was prototyped as in Example 1, and microwave coil 114 was set at a distance of approximately 1 cm from the sample (diamond 100) unlike Example 1.

For each of samples B, D1, and D2, semiconductor laser beams were emitted to a sample central portion without going through such an optical system as a lens, and red fluorescence radiated from the sample central portion was detected by a light reception element by using a panopticon at a magnification of 50× (a long lens 126). In order to prevent laser beams from entering the light reception element, a filter which cut off green light was employed. A microwave antenna distant by approximately 1 cm was closest to the sample (a diamond source material).

Then, an apparatus which generated a simulated magnetic waveform (AC current source 122 and pulsed power supply 124) was prepared as in Example 1. Copper wire X 116 and copper wire Y 118 were arranged at a closest distance of 0.5 cm from the sample of diamond configured to perform sensing.

Preliminary measurement as below was initially conducted. When the sample of diamond was irradiated with semiconductor laser beams having a wavelength of 520 nm while it was irradiated with microwaves, red fluorescence around a wavelength of 638 nm was detected. When a microwave frequency was swept around 2.87 GHz, fluorescence exhibited two relative minimum values (valleys) at different frequencies. Unlike Example 1, the valleys were wide and two valleys overlapped with each other. It could be confirmed, however, that there were two relative minimum values. This is because of presence of NV⁻ centers in various states (atoms having nuclear magnetism, such as $^{13}C$ and $^{14}N$, being arranged around NV⁻ centers) in samples B, D1, and D2. When a concentration of the NV⁻ centers was high, a distribution width was larger and greater. By emitting microwaves at a frequency greatly distant from the frequency at the relative minimum value, fluorescence intensity exhibited the maximum value. Even when the microwave was fixed to a single frequency included in the valley at the relative minimum value and emission of the microwaves was stopped (output of microwaves was set to zero), fluorescence exhibited the maximum value.

Then, main measurement was conducted as below. A DC current was fed to copper wire X 116 by a constant current power supply, and it was confirmed that a frequency interval between two relative minimum values was varied in the sample of diamond nearby when the current was flowing. Samples B, D1, and D2 used in the present experiment were relatively gradual in variation in fluorescence intensity with respect to variation in magnetism, and a wide magnetic range could be confirmed based on fluorescence intensity.

Then, measurement as below was conducted: The sample was irradiated with pulsed beams as laser beams having a duty of 50% (a pulse width being half a cycle) in each of cycles of 10 msec. (100 Hz) and 0.1 msec. (10 kHz), and red fluorescence was observed. Consequently, emission in each cycle of 100 Hz and 10 kHz was confirmed while laser beams were emitted.

Figure 27:
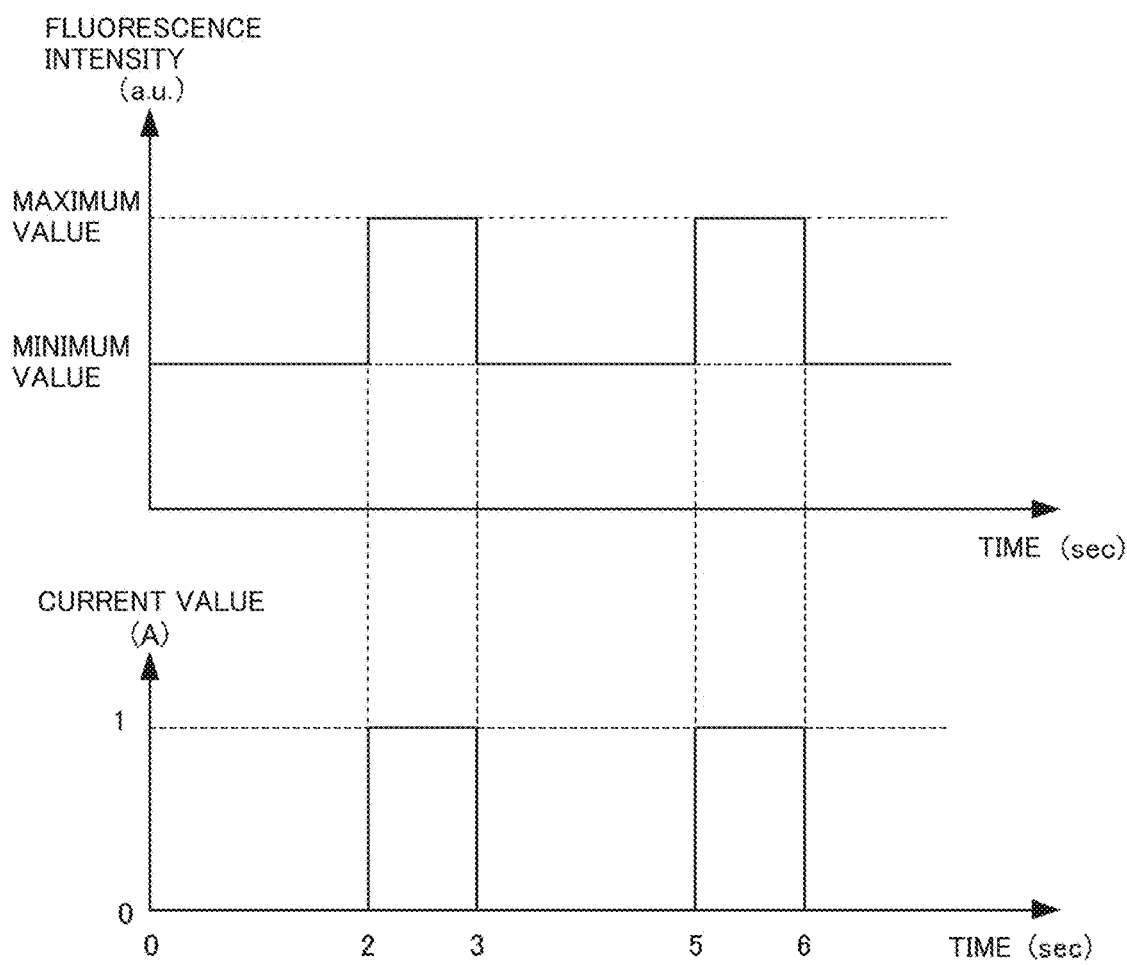
FIG. 27 is a graph showing a measurement condition and a result of measurement in Example 2.
Figure 28:
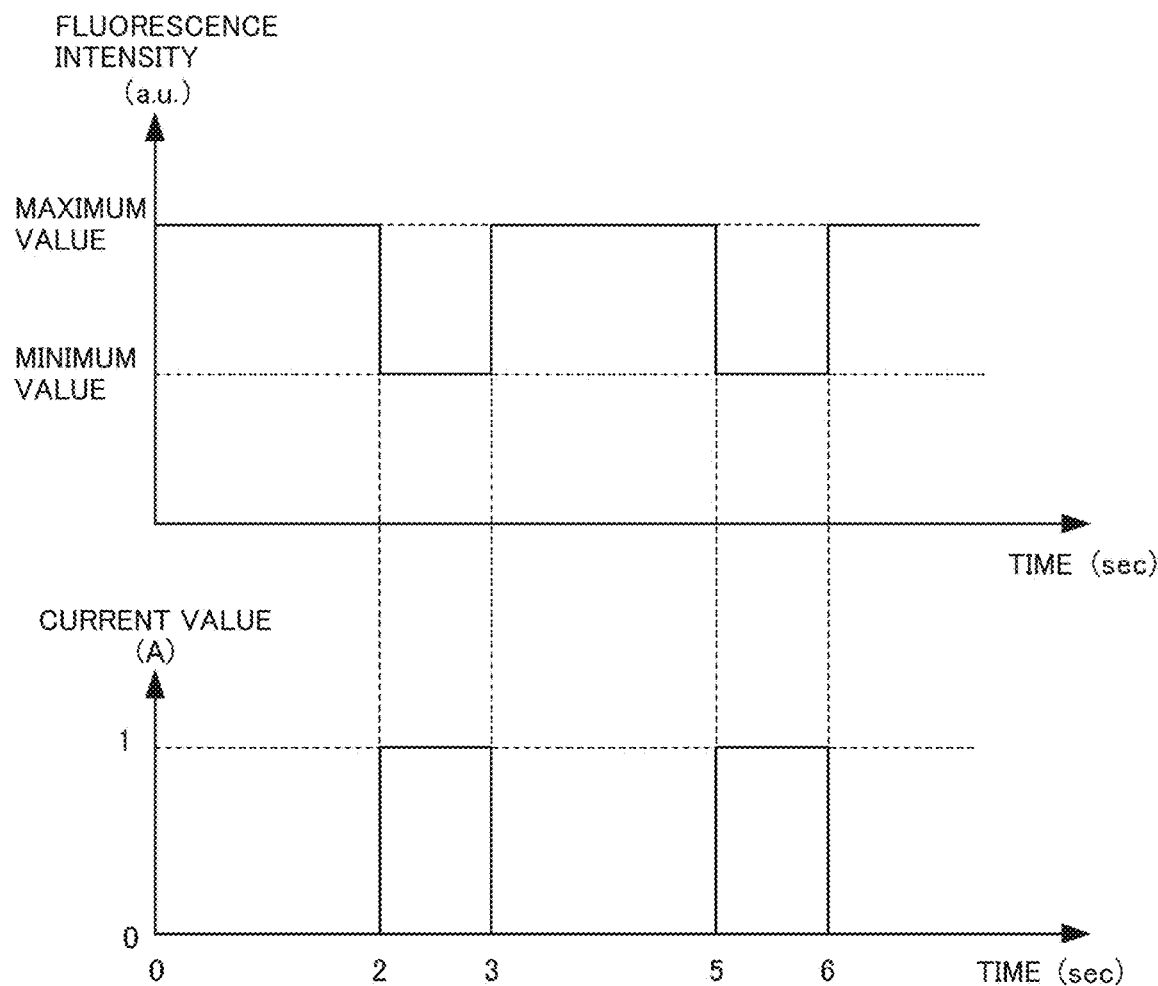
FIG. 28 is a graph showing a measurement condition and a result of measurement different from those in FIG. 27 in Example 2.

Supply of a constant current (1 A) to copper wire X 116 was turned on (power feed) or off (non-power feed) while a pulse interval (a cycle) of laser beams was set to 10 msec. (100 Hz), microwaves at a frequency corresponding to one of the two relative minimum values of fluorescence intensity were emitted, and fluorescence intensity attained to the relative minimum value. FIG. 27 shows a temporal change pattern of fluorescence intensity observed at that time. Supply of the current to copper wire X 116 was turned off and again turned on while a constant current (1 A) to copper wire X 116 was turned on and microwaves at a frequency at which fluorescence intensity attained to the relative minimum value were emitted. FIG. 28 shows a temporal change pattern of fluorescence intensity observed at that time. Though FIGS. 27 and 28 each show a solid line, the solid line is actually a group of data at an interval of 10 msec. (100 Hz). By thus knowing pulsed irradiation with excitation laser beams and a temporal change pattern of fluorescence intensity as a response thereto, accurate match of the temporal change pattern of measured fluorescence intensity with a pattern of the current to the copper wire (pattern matching) could be confirmed contactlessly at a short distance. Without knowing a temporal change pattern, uncertainty as to whether or not a current was derived from copper wire X inevitably remained.

Figure 29:
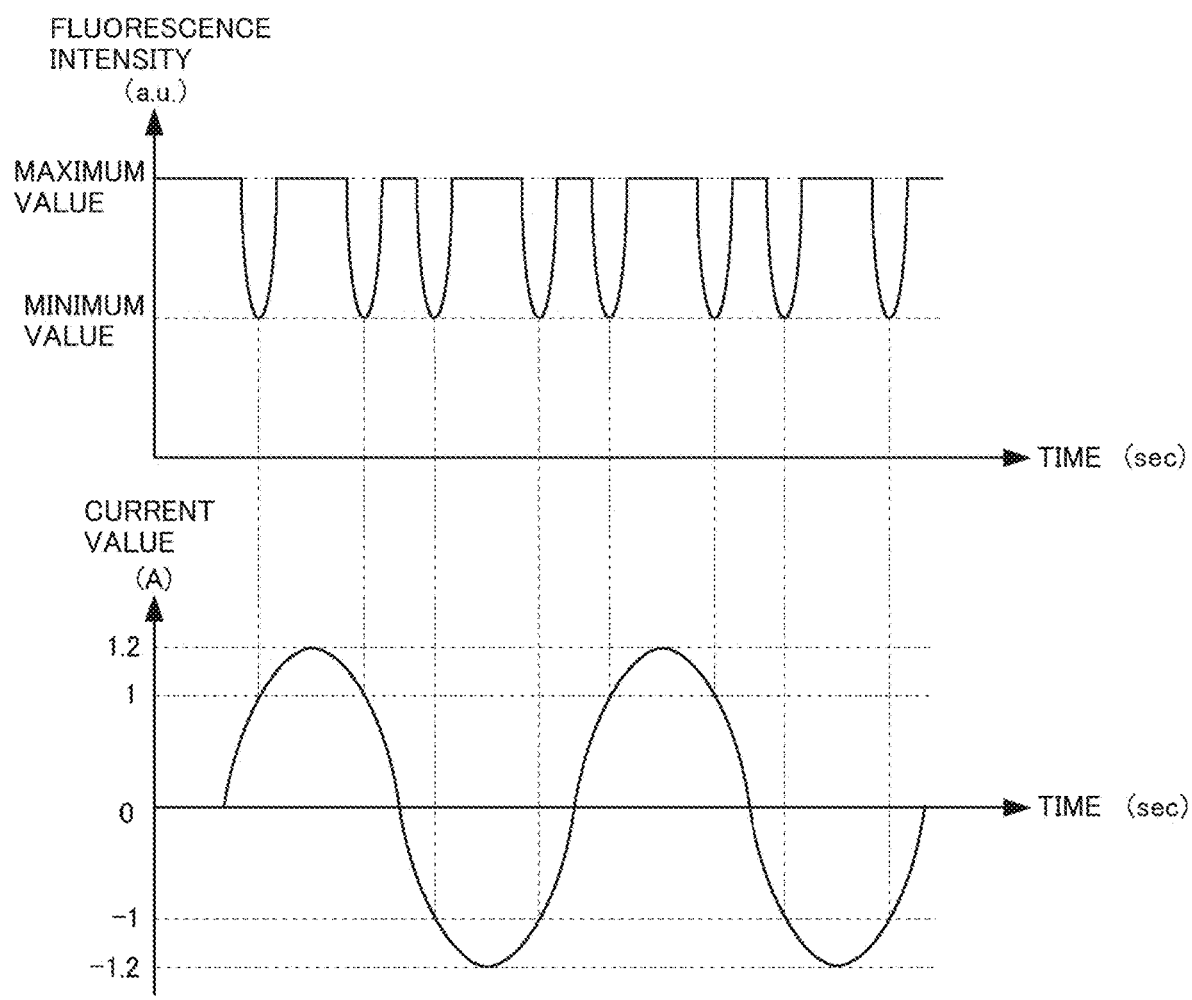
FIG. 29 is a graph showing a measurement condition and a result of measurement different from those in FIGS. 27 and 28 in Example 2.

Then, while a current of 1 A was fed to copper wire X 116 with a pulse interval (cycle) of laser beams being set to 0.1 msec. (10 kHz) and while fluorescence intensity was at the relative minimum value by emitting microwaves at a frequency corresponding to one of the two relative minimum values of fluorescence intensity, an AC current having a frequency of 60 Hz and a maximum value of 1.2 A was fed to copper wire X 116. FIG. 29 shows fluorescence intensity measured at this time together with a waveform of the current through copper wire X 116. Fluorescence intensity expressed with an arbitrary unit (a. u.) exhibited the relative minimum value each time a current value attained to 1 A. Though FIG. 29 shows a solid line, the solid line is actually a group of data at an interval of 0.1 msec. A temporal change pattern of magnetism could be found by analyzing the temporal change pattern of fluorescence intensity, and change over time in current fed to copper wire X 116 could be known. Since relation between fluorescence intensity and magnetism is different for each diamond sample, correspondence should be studied in advance and a database should be created. (Sensitivity to magnetism was lower in the order of samples B, D1, and D2, and a range of magnetism to be measured was larger in this order.) Though data (fluorescence intensity) cannot be obtained from all portions of sine waves, it has been known that sine waves are simple even in part. Therefore, by conducting analysis under such a condition, match with a pattern of the current which flowed through copper wire X 116 could be confirmed. A phase of the AC current could also be sensed from a pattern of obtained fluorescence intensity. Such assumption of conditions is also made in an actual situation and it is an effective method of processing data.

Figure 30:
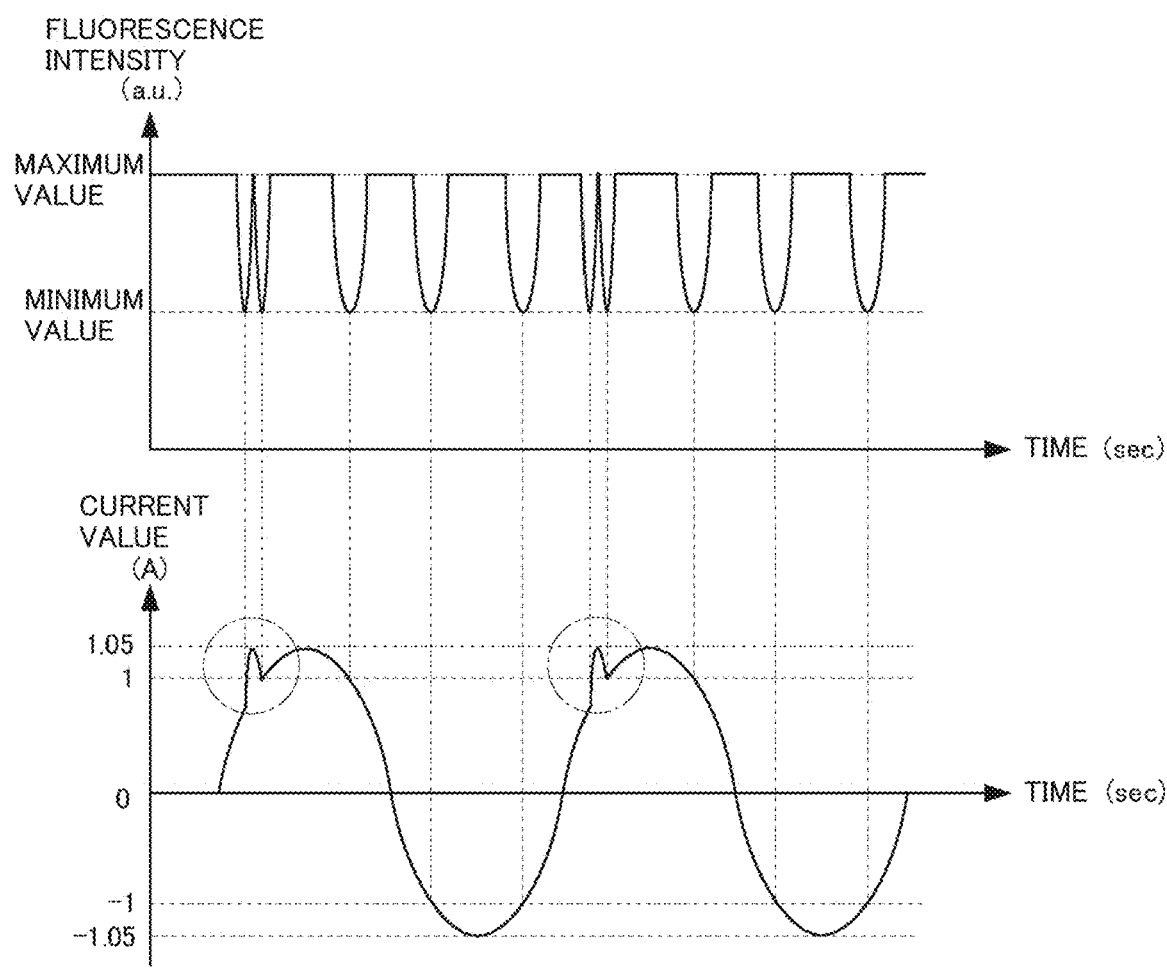
FIG. 30 is a graph showing a measurement condition and a result of measurement different from those in FIGS. 27 to 29 in Example 2.

With copper wire X 116 and copper wire Y 118 being set, an AC current at 60 Hz having a maximum value of 1.05 A was fed to copper wire X 116 and a pulsed current having a pulse interval (cycle) of 60 Hz, a pulse width of 1 msec., and a maximum current value of 1 mA was fed to copper wire Y 118. FIG. 30 shows fluorescence intensity measured at this time together with a combined waveform of currents fed to copper wire X 116 and copper wire Y 118. Fluorescence intensity exhibited the relative minimum value each time a total of the AC current and the pulsed current attained to 1 A. Though FIG. 30 shows a solid line, the solid line is actually a group of data at an interval of 0.1 msec. An apparatus with a function to accumulate temporal change patterns of fluorescence intensity and an apparatus which analyzed accumulated data were provided. The temporal change pattern of fluorescence intensity could be converted to a magnetism temporal change pattern owing to a database of samples. With the data on such temporal change patterns, a pulsed current could be confirmed also based on frequency analysis. Specifically, a component not higher than 70 Hz was cut off by a high-pass filter from extracted data (for excluding a frequency of 60 Hz of the AC current fed to copper wire X 116), and a component equal to or higher than that was analyzed. Then, a component at 1 kHz of the pulsed current was detected.

Figure 31:
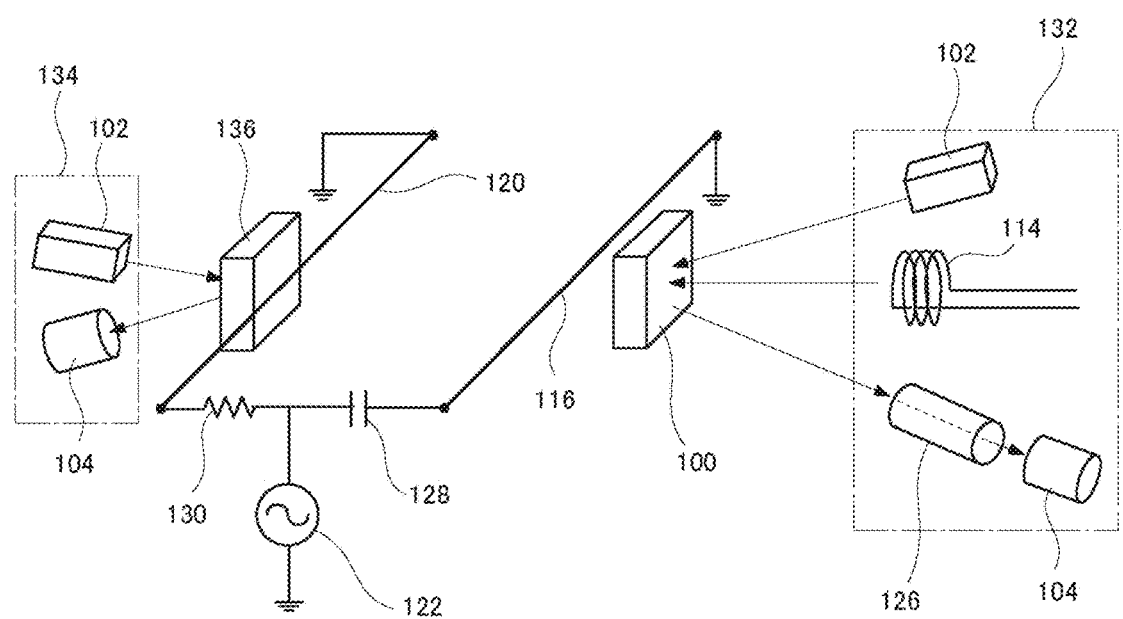
FIG. 31 is a schematic diagram showing a configuration of an apparatus different from that in FIG. 26 used in Example 2.

An experimental apparatus configured as shown in FIG. 31 was manufactured and an experiment was conducted. Copper wire X 116 and a copper wire Z 120 were connected in parallel with a capacitor 128 and a resistor 130 directly connected to each other being interposed, and an AC current at a prescribed frequency was supplied from AC current source 122 to a connection node between capacitor 128 and resistor 130. A resistance value of resistor 130 was set to an ignorably small value as compared with a resistance of copper wire X 116 and copper wire Z 120, and a capacity of capacitor 128 was set to be high such that an impedance thereof was ignorable as compared with an impedance of copper wire X 116 and copper wire Z 120. A voltage and a current of copper wire X 116 were different in phase by 90° from a voltage and a current of copper wire Z 120. Diamond 136 was arranged in proximity to copper wire Z 120, separately from diamond 100 arranged in proximity to copper wire X 116. A measurement system 132 for diamond 100 was implemented by laser light source 102, microwave coil 114, long lens 126, and semiconductor light reception element 104, and a measurement system 134 for diamond 136 was implemented similarly to measurement system 132. The microwave coil and the long lens in measurement system 134 are not shown. A pair of samples was samples manufactured with the same method, and each of samples B, D1, and D2 was employed. With any sample, a phase difference identical in value to the AC current could be sensed.

Similarly to measurement with the use of measurement system 132, of intensity of radiated fluorescence by irradiating diamond 100 in proximity to copper wire X 116 with laser beams and microwaves while a current was supplied from AC current source 122 to copper wire X 116 and copper wire Z 120, intensity of radiated fluorescence was measured with the use of measurement system 134, by irradiating diamond 136 in proximity to copper wire Z 120 with laser beams and microwaves. A phase difference by 90° could be sensed by analyzing obtained results as above.

Since the conventional diamond magnetic sensor mainly aimed to be high in sensitivity (to sense very small magnetic field), it suffered from overrange if a measurement site was slightly displaced, and it was unable to know a waveform of a current which produced magnetic field by sensing a temporal change pattern. According to one manner of the present invention, single-crystal diamond in which various types of background magnetism were arranged around NV⁻ centers was manufactured and sensitivity was maintained without allowing two relative minimum values of fluorescence intensity to disappear. Thus, a sufficient difference in fluorescence intensity (a difference between the relative minimum value and the maximum value being at least 2%) and a wide magnetic field range (not lower than 10 nT) could be ensured so that a temporal change pattern could be obtained. When a concentration of NV⁻ centers was higher than 200 ppm, two relative minimum values could no longer be observed and a sufficient difference in fluorescence intensity could not be obtained. A sample X in which a concentration of $^{13}C$ was 28% was prototyped separately to the sample above and subjected to measurement. Consequently, when a concentration of $^{13}C$ was higher than 20% in spite of a concentration of NV⁻ centers being 1 ppm, two relative minimum values could no longer be observed and a sufficient difference in fluorescence intensity could not be obtained. Furthermore, an experiment similar to the above was conducted with a pulse interval of laser beams being set to 1 μsec. Then, a similar phase difference could accurately been sensed. A pulsed current fed to copper wire Y 118 could also be sensed exactly in the same manner as in Example 1.

Example 3

An experiment was conducted by using each of samples A, C, E1, E2, and F of diamond. When the experiment was initially conducted with a method the same as in Example 1 by using each of samples A and C (see FIG. 21) and the sample was observed at a high magnification, some luminous points of fluorescence were observed. Since each luminous point had different inner magnetic field background (nuclear magnetism), it satisfied such a condition that fluorescence intensity attained to a relative minimum value in external magnetic field different in magnitude in spite of irradiation with microwaves at the same frequency (which is also referred to as resonance below). Such an experiment that a current as shown in FIGS. 29 and 30 in Example 2 was fed to copper wire X 116 and copper wire Y 118 to form external magnetic field and variation in fluorescence intensity was measured was conducted. By processing data on variation in fluorescence intensity and variation in fluorescent position (a position where fluorescence was observed), a temporal change pattern of magnetism corresponding to each fluorescence intensity pattern in FIGS. 29 and 30 could be obtained. Namely, a function in place of frequency sweep in Example 1 could be performed by a temporal change pattern of the position. By conducting observation to include at least one thousand luminous points, a position of light emission and a frequency of microwaves resonant in external magnetic field (a frequency of microwaves at which fluorescence intensity attained to a relative minimum value) could be determined to be in correspondence with each other, and observation in which the position of light emission was present somewhere in spite of significant change in external magnetic field could be made. Thus, by accumulating correlation with external magnetic field in a database in advance, external magnetic field could be measured based on a position where a relative minimum value of fluorescence intensity was exhibited and a temporal change pattern or a positional change pattern of fluorescence intensity could also be obtained over time. When data was processed, a temporal change pattern of magnetic field could be obtained over a large range of magnetic field intensity. The present approach was characterized by replacing sweep of a microwave frequency with storage of position data equivalent to change in frequency in advance as a database. The approach obtained a temporal change pattern of magnetism based on combined information of information on individual fluorescence intensity and information on a fluorescent position.

Then, an experiment for identifying fluorescence of dots aligned in lattices by magnifying samples E1 and E2 with a long lens set in a stage preceding a light reception element was conducted in the experiment system the same as in Example 2 (see FIG. 26). In each of samples E1 and E2, since one light emission region where areas (NV⁻ center regions) including NV⁻ centers of 20 μm φ were aligned in lattices had a plurality of NV⁻ centers, fluorescence intensity higher than that of a single NV⁻ center was obtained as an absolute value of intensity. When magnetic field was applied to the entire sample, an Fe array on the rear side of the substrate held magnetic field, and magnetic field having intensity substantially in accordance with an area of each Fe array was produced. Therefore, a plurality of areas in an array had different magnetic field backgrounds (magnetic fields by the Fe array), and a relative minimum value of fluorescence intensity was exhibited at a different microwave frequency. Magnification was lower, fluorescence intensity was higher, a range of frequencies was also wider, and a wider magnetic field range could be covered than in measurement of samples A and C at a high magnification. Since Fe dots were aligned in lattices and a difference in magnetic field intensity in the inside could be designed, measurement was readily conducted. An experiment for measuring variation in fluorescence intensity by forming external magnetic field by feeding a current as shown in FIGS. 29 and 30 in Example 2 to copper wire X 116 and copper wire Y 118 was conducted. By processing data on variation in fluorescence intensity and variation in fluorescent position, a temporal change pattern of magnetism corresponding to the fluorescence intensity pattern in FIGS. 29 and 30 could be obtained. A difference of samples E1 and E2 from samples A and C was that a group of convenient NV⁻ centers could be created by making a design in advance instead of searching for a group of NV⁻ centers involved with light emission convenient for measurement.

An experiment was conducted similarly to the above by using sample F. Consequently, though NV⁻ center regions of sample F had a size of 40 μm φ, it could be confirmed that a function substantially the same as that of samples E1 and E2 (sensing of magnetism produced by an AC current and sensing of magnetism produced by a pulsed current in the AC current) could be performed.

As set forth above, individual slight variation in magnetism could be measured over a large magnetic field range by both of a method of making observation such that NV⁻ centers served as at least one thousand luminous points (an individual one could be defined as an NV⁻ center region) at a high magnification in each of samples A and C and addressing each of them and a method of forming different background magnetism by designing an array (NV⁻ center regions) in lattices including a plurality of NV⁻ centers at a low magnification in each of samples E1, E2, and F and combining the array with a magnetic array. Namely, small magnetic field in large magnetic field could be measured. A cause of magnetic field (for example, a current) could be specified by measuring such a temporal change pattern.

Example 4

Though fluorescence intensity of an individual array was observed by using samples E1, E2, and F above, the entire sample was irradiated with excitation light in the present Example and intensity of fluorescence radiated from the entire sample was collectively observed. There were a plurality of dots analogous in characteristics (points in lattices), and a different number of dots were set for each different characteristic. Namely, the dots were weighted for each different characteristic. An analogous characteristic means NV$^-$ centers resonant at the same microwave frequency. The different characteristic means a different resonant microwave frequency. Therefore, a microwave frequency is known based on fluorescence intensity which exhibits a relative minimum value. Superimposition of all obtained fluorescence intensities provides one great variation in fluorescence intensity. Therefore, fluorescence intensity substantially determines a microwave frequency. As a resonant frequency is lower, the number of dots should be larger, and as a resonant frequency is higher, the number of dots should be smaller. By doing so, a graph of fluorescence intensity having a wide and large valley with respect to a microwave frequency can be formed. Relation between fluorescence intensity and a microwave frequency, that is, relation between fluorescence intensity and magnetism, was determined by performance of diamond and performance of design, and could be stored as a database in advance so that data on magnetism could be calculated based on fluorescence intensity. In addition, since arbitrary design could be made, relation between fluorescence intensity and magnetism could loosely be set and measurement over a wide range of magnetism could be conducted. Similarly, a temporal change pattern could also be obtained. When a current was fed to copper wire X 116 as in FIG. 29 which showed measurement in Example 2, based on variation in measured fluorescence intensity of the entire sample, information on external magnetic field could be observed as a temporal change pattern, a temporal change pattern of magnetism could be known, and a factor for magnetism could be specified as an AC current. Since the temporal change pattern was also in conformity with an AC waveform, a phase thereof could also be known. Thus, a difference from a waveform of a current having an orthogonal phase difference could also be confirmed as in Example 2 (see FIG. 31). Furthermore, when a current was fed to copper wire X 116 as in FIG. 30 which showed measurement in Example 2 as well, based on variation in measured fluorescence intensity of the entire sample, information on external magnetic field could be observed as a temporal change pattern, a temporal change pattern of magnetism could be known, and a factor for magnetism could be calculated as being distinguished between an AC current and a pulsed current similarly in the graph in an upper portion of FIG. 30.

Example 5

Figure 32:
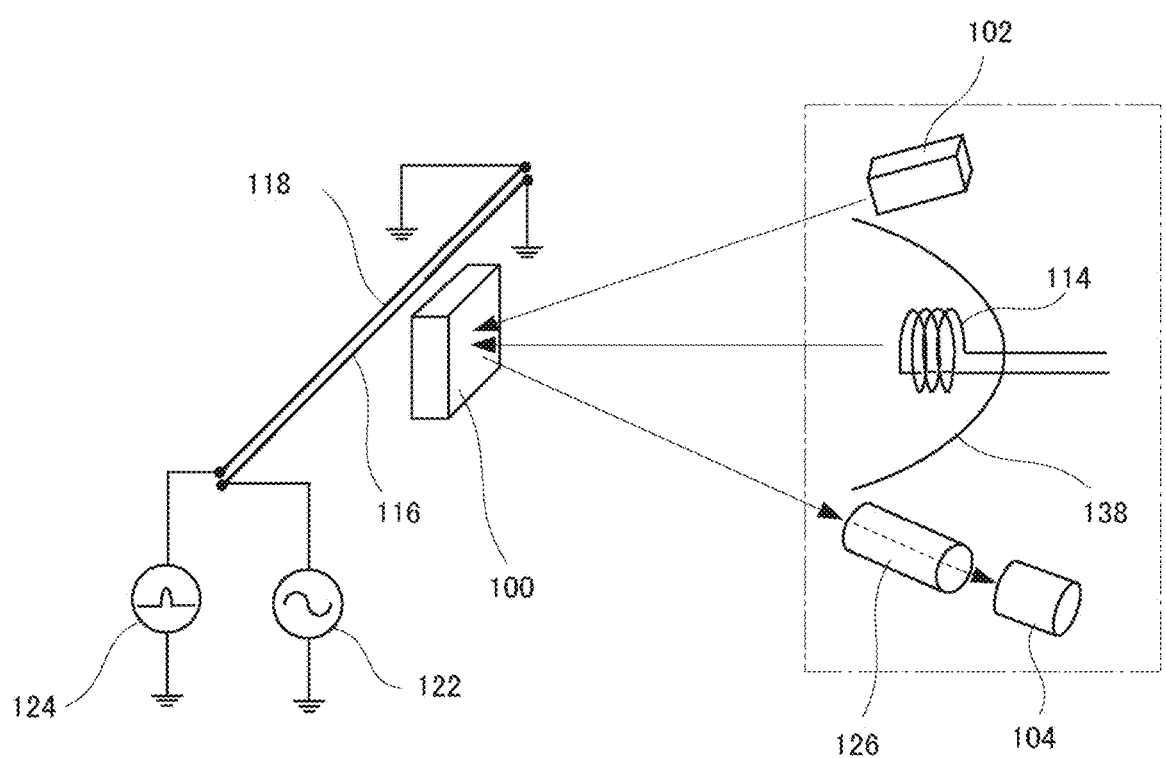
FIG. 32 is a schematic diagram showing a configuration of an apparatus used in Example 5.

An experimental apparatus configured as shown in FIG. 32 was manufactured and an experiment was conducted by using each of samples E1, E2, and F of diamond. The sample was irradiated with microwaves by using an oval spherical mirror 138. Specifically, the sample was set at one focus of an oval spherical surface (a spheroid) partly constituted of oval spherical mirror 138, and an antenna in a form of a solenoid coil (microwave coil 114) was arranged at the other focus. Oval spherical mirror 138 was located only on a side where the antenna in the form of the coil was arranged, and a side facing diamond 100 was open. Microwaves radiated from the antenna arranged at the focus, however, were reflected by oval spherical mirror 138 and collected at diamond 100 arranged at another focus. An end surface (an open portion) of oval spherical mirror 138 had a diameter of 30 cm, and the focus where microwave coil 114 was arranged was distant by 20 cm from the end surface of oval spherical mirror 138. The sample was irradiated with excitation laser from a laser light source arranged at a position distant by 30 cm from the sample (diamond 100), and fluorescence radiated from the sample was observed with a long-focus microscope arranged at a position distant by 20 cm from the sample. With such a configuration, an AC current was fed to copper wire X 116 as shown in FIG. 29 in Example 2, information on external magnetic field could be observed as a temporal change pattern based on an address of an magnetic array and variation in fluorescence intensity at that address, a temporal change pattern of magnetism could be known, and a factor for magnetism could be specified as an AC current. Even when the sample of diamond serving as a sensor portion was arranged remotely from a measurement instrument constituted of an excitation semiconductor element portion (a laser light source), a light reception semiconductor portion (a light reception element), and a microwave generator including a microwave coil, a temporal pattern of magnetic field and magnetism could be sensed and a cause of magnetic field could be sensed.

Example 6

Arrangement of each of samples E1, E2, and F of diamond serving as the sensor portion remotely from a measurement electronic element (excitation semiconductor laser and a semiconductor light reception element) is the same as in Example 5. The sample of diamond serving as the sensing portion was set in an environment in vacuum (0.01 atmosphere), in water at a high pressure (10 atmospheres), and in oil at a high temperature (200° C.), laser beams and microwaves were emitted remotely through a window of quartz glass, and fluorescence was detected. A configuration, arrangement, and measurement conditions were otherwise the same as in Example 5. Though the environment around the sensing portion (the sample of diamond) was significantly different from the standard state (for example, one atmosphere (101325 Pa) 0° C.), measurement basically the same as above could be conducted.

Example 7

The sample and the measurement system the same as in Example 1 were adopted, and a coil for generating magnetic field was arranged to cover the sample of diamond serving as the sensing portion. Magnetic field was generated such that AC magnetic field generated by an AC current through copper wire X 116 at a position where the sample of diamond was arranged was canceled by the coil for generating magnetic field. Since combined magnetic field formed by copper wire X 116 and the coil for generating magnetic field was not uniform on diamond, it could not cancel magnetic field in a strict sense. When a portion to be observed was small and AC magnetic field was expected, however, the magnetic field was substantially canceled. In this state, variation in magnetic field could be sensed at all phases of sinusoidal magnetic field which remained without being canceled and could be sensed as a temporal change pattern, and pulsed magnetic field in the AC magnetic field could be sensed as shown in FIG. 30 (see Example 2).

Example 8

The sample and the measurement system the same as in Example 2 were adopted, and the sample of diamond serving as the sensing portion and a sensing circuit portion including an excitation semiconductor element for sensing and a light reception element were manufactured on the same circuit board so that magnetism and a temporal change pattern of magnetism could be sensed. By sensing AC magnetic field as shown in FIG. 29 in Example 2, an example in which they were not manufactured on the same circuit board and an example in which they were manufactured on the same circuit board were compared with each other. Measurement was conducted with a value of a current for forming AC magnetic field being gradually lowered from 1.2 A in Example 2 to 0.12 A, 12 mA, and 1.2 mA. When they were not manufactured on the same circuit, measurement in the example of 1.2 mA was difficult. When they were manufactured on the same circuit, however, a magnetism temporal change pattern of AC magnetic field could be measured also in the example of 1.2 mA.

Example 9

An experiment was conducted by adopting the sample and the measurement system the same as in Example 7 and arranging also a coil for generating magnetic field as in Example 7. Magnetic field was generated such that the coil for generating magnetic field canceled AC magnetic field generated by an AC current through copper wire X 116 at a position where the sample of diamond was arranged, and magnetic field generated by a pulsed current through copper wire Y 118 was increased by another coil. The AC magnetic field caused by copper wire X 116 could be canceled as in Example 7, and magnetic field generated by copper wire Y 118 could be applied to the diamond as being amplified and could be sensed as a temporal change pattern of magnetism. Pulsed magnetic field in the AC magnetic field shown in FIG. 30 (Example 2) could be sensed. In the present Example, a similar result was obtained also when the sample and a circuit portion of the sensing portion were placed within a magnetic shield and diamond was irradiated through the antenna with only magnetism (a current) from the coil used for increasing magnetic field generated by the pulsed current through copper wire Y 118.

Though the present invention has been described above by describing embodiments, the embodiments are illustrative and the present invention is not restricted only to the embodiments. The scope of the present invention is defined by each claim in the scope of claims with reference to the description in detailed description of the invention and includes any modifications within the scope and meaning equivalent to the terms of the claims.

REFERENCE SIGNS LIST

1, 2 diamond; 3 magnetic array; 3a, 3b magnetic material; 10 microwave generator; 11 frequency sweep apparatus; 12 microwave; 20 excitation light generator; 21 excitation light; 22 fluorescence; 30 fluorescence sensor; 31 fluorescence sensor array; 32a, 32b light reception element; 40 pattern measurement apparatus; 60 circuit board; 70 cancellation coil; 80 magnetic shield member; a, b, c, d, e, R1, R2, R3, R4 region; C1 cross-section; 100, 136 diamond (sample); 102 laser light source; 104 semiconductor light reception element; 106 optical lens system; 108 microscope lens; 110 triangular prism; 112 reflector; 114 microwave coil; 116 copper wire X; 118 copper wire Y; 120 copper wire Z; 122 AC current source; 124 pulsed power supply; 126 long lens; 128 capacitor; 130 resistor; 132, 134 measurement system; 138 oval spherical mirror

The invention claimed is:

1. A diamond magnetic sensor including diamond containing at least one $NV^-$ center, a microwave generator which emits microwaves to the diamond, an excitation light generator which emits excitation light to the $NV^-$ center of the diamond, and a fluorescence sensor which receives fluorescence produced from the $NV^-$ center of the diamond, the diamond magnetic sensor comprising
   a pattern measurement apparatus which measures a temporal change pattern of magnetic field intensity based on variation in fluorescence intensity sensed by the fluorescence sensor,
   wherein the pattern measurement apparatus performs a function to control sweep of a frequency of the microwaves, a function to specify two different frequencies of the microwaves at which the fluorescence intensity is produced including a relative minimum value of the fluorescence intensity, and a function to detect magnetic field intensity based on a difference of the specified two different frequencies.

2. The diamond magnetic sensor according to claim 1, wherein
   the pattern measurement apparatus measures the temporal change pattern of the magnetic field intensity by repeating detection of the magnetic field intensity by repeating sweep of the frequency.

3. The diamond magnetic sensor according to claim 1, the diamond magnetic sensor further comprising a data analysis apparatus which separates intensity of magnetic field originating from a measurement environment and intensity of magnetic field originating from an object to be measured from each other, based on the temporal change pattern.

4. The diamond magnetic sensor according to claim 3, wherein
   the data analysis apparatus provides filtering based on a frequency in the temporal change pattern.

5. A diamond magnetic sensor comprising:
   diamond in a form of a plate containing a plurality of $NV^-$ center regions in a plan view;
   a magnetic array arranged in correspondence with the $NV^-$ center regions and the magnetic array having a predetermined intensity of magnetic field;
   a microwave generator which emits microwaves to the diamond;
   an excitation light generator which emits excitation light to the diamond; and
   a fluorescence sensor array which individually receives fluorescence produced from the plurality of $NV^-$ center regions.

6. The diamond magnetic sensor according to claim 1, the diamond magnetic sensor further comprising a cancellation coil which weakens ambient magnetic field applied to the diamond by producing prescribed magnetic field.

7. The diamond magnetic sensor according to claim 1, wherein
   the diamond, the microwave generator, the excitation light generator, and the fluorescence sensor or a fluorescence sensor array are mounted on a single circuit board directly or with another member being interposed.

8. The diamond magnetic sensor according to claim 1, the diamond magnetic sensor further comprising:
   a magnetic shield which cuts off ambient magnetic field applied to the diamond; and
   an antenna which introduces an external signal including an object to be sensed into inside of the magnetic shield.

9. A diamond magnetic sensor including diamond in a form of a plate containing a plurality of $NV^-$ center regions in a plan view, a magnetic array arranged in correspondence with the plurality of $NV^-$ center regions and the magnetic array having a predetermined intensity of magnetic field, a microwave generator which emits microwaves to the diamond, an excitation light generator which emits excitation light to the diamond, and a fluorescence sensor which receives fluorescence produced from the plurality of $NV^-$ center regions, magnitude of a relative minimum value of intensity of fluorescence produced from the plurality of $NV^-$ center regions being weighted differently for each $NV^-$ center region, in accordance with a frequency of the emitted microwaves and magnetic field applied by the magnetic array.

10. A diamond magnetic sensor comprising:

diamond in a form of a plate containing a plurality of $NV^-$ center regions in a plan view; and a magnetic array arranged in correspondence with the $NV^-$ center regions and the magnetic array having a predetermined intensity of magnetic field, the diamond and the magnetic array being in contact with each other.

11. The diamond magnetic sensor according to claim 1, wherein the diamond and an electronic circuit portion including the fluorescence sensor are distant from each other by at least 1 cm, and no member which electrically connects the diamond and the electronic circuit portion to each other is interposed between the diamond and the electronic circuit portion.

12. The diamond magnetic sensor according to claim 11, wherein the electronic circuit portion including the fluorescence sensor is spaced apart from the diamond by a solid through which visible light or infrared light passes, and can be used in at least one environment of a temperature environment different from a standard state, a pressure environment different from the standard state, and a gas atmosphere other than air.

13. The diamond magnetic sensor according to claim 1, wherein the relative minimum value of the fluorescence intensity is produced at both of the two different frequencies of the microwaves.

\* \* \* \* \*